(12) United States Patent
Maruyama et al.

(10) Patent No.: US 6,535,412 B1
(45) Date of Patent: Mar. 18, 2003

(54) SEMICONDUCTOR MEMORY DEVICE CAPABLE OF SWITCHING OUTPUT DATA WIDTH

(75) Inventors: Yukiko Maruyama, Hyogo (JP); Yasuhiko Tsukikawa, Hyogo (JP); Mikio Asakura, Hyogo (JP); Takashi Itou, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/557,866

(22) Filed: Apr. 24, 2000

(30) Foreign Application Priority Data

Oct. 26, 1999 (JP) ............................................. 11-303930

(51) Int. Cl.[7] ................................................ G11C 7/00
(52) U.S. Cl. ................ 365/63; 365/230.01; 365/189.03; 365/189.05; 365/230.06; 365/230.08
(58) Field of Search ........................ 365/189.01, 189.03, 365/189.05, 230.01, 230.06, 230.08, 63

(56) References Cited

U.S. PATENT DOCUMENTS

| | | | |
|---|---|---|---|
| 5,793,686 A | | 8/1998 | Furutani et al. |
| 5,953,261 A | * | 9/1999 | Furutani et al. ........ 365/189.05 |
| 6,026,029 A | * | 2/2000 | Dosaka et al. ......... 365/189.01 |
| 6,130,852 A | * | 10/2000 | Ohtani et al. .......... 365/230.03 |
| 6,170,036 B1 | * | 1/2001 | Konishi et al. ............. 711/104 |

* cited by examiner

Primary Examiner—Viet Q. Nguyen
(74) Attorney, Agent, or Firm—McDermott, Will & Emery

(57) ABSTRACT

In response to an output data width switching mode signal, a predecoder zone+selector zone outputs selection signals SEL0 to SEL7 and WORDA to WORDC to a preamplifier+write driver zone. The preamplifier+write driver zone can switch connection between global I/O lines GIO<0> to GIO<7> and a data bus in response to these selection signals. Read data is output to a pad without through a selector circuit or the like on the data bus, whereby a simple structure can be obtained with no critical adjustment of a delay time resulting from mode switching or address change.

8 Claims, 30 Drawing Sheets

| INTERNAL COLUMN ADDRESS | X4 MODE | X8 MODE | X16 MODE | MULTI-BIT TEST |
|---|---|---|---|---|
| CA9 | A9 | A9 | A9 | "H" |
| ZCA9 | /A9 | /A9 | /A9 | "H" |
| CA10 | A10 | A10 | "H" | "H" |
| ZCA10 | /A10 | /A10 | "H" | "H" |
| CA11 | A11 | "H" | "H" | "H" |
| ZCA11 | /A11 | "H" | "H" | "H" |

*FIG.11*

| INTERNAL CONTROL SIGNAL | X16 MODE | X8 MODE | X4 MODE | MULTI-BIT TEST |
|---|---|---|---|---|
| B16 | "H" | "L" | "L" | X |
| B8 | "L" | "H" | "L" | X |
| ZMBTOR | "H" | "H" | "H" | "L" |
| WORDA | "H" | "L" | "L" | "L" |
| WORDB | "L" | "H" | "L" | "L" |
| WORDC | "L" | "L" | "H" | "H" |

| GIO | X4 MODE | X8 MODE | X16 MODE | MULTI-BIT TEST |
|---|---|---|---|---|
| GIO⟨0⟩ | WDATA0 | WDATA0 | WDATA0 | WDATA0 |
| GIO⟨1⟩ | WDATA0 | WDATA2 | WDATA6 | WDATA0 |
| GIO⟨2⟩ | WDATA0 | WDATA2 | WDATA2 | WDATA0 |
| GIO⟨3⟩ | WDATA0 | WDATA0 | WDATA4 | WDATA0 |
| GIO⟨4⟩ | WDATA0 | WDATA0 | WDATA4 | WDATA0 |
| GIO⟨5⟩ | WDATA0 | WDATA2 | WDATA2 | WDATA0 |
| GIO⟨6⟩ | WDATA0 | WDATA2 | WDATA6 | WDATA0 |
| GIO⟨7⟩ | WDATA0 | WDATA0 | WDATA0 | WDATA0 |

SEMICONDUCTOR MEMORY DEVICE CAPABLE OF SWITCHING OUTPUT DATA WIDTH

BACKGROUND OF THE INVENTION

1. Field of the Invention

The present invention relates to a semiconductor memory device, and more specifically, it relates to a data bus employed for transmitting data in a semiconductor memory device.

2. Description of the Background Art

A dynamic random access memory (hereinafter referred to as DRAM) includes an EDO (extended data out) DRAM, which can consecutively read data at a high speed.

The EDO DRAM can read data at a higher speed than a general DRAM.

The general DRAM specifies a row address and a column address for reading data, and thereafter temporarily nullifies the column address when shifting to a subsequent address.

The EDO DRAM holds a column address and hence a memory controller specifying any column address can immediately nullify the column address. Thus, the speed of the system is increased since the column address may not be held until reading data.

FIGS. 28A and 28B illustrate the structure of data buses of a conventional EDO DRAM.

Referring to FIGS. 28A and 28B, this EDO DRAM has memory mats 504#1 to 504#4 arranged in two rows and two columns, each having a rectangular shape.

Each memory mat outputs 32 pairs of global I/O lines I/O0 to I/O31, which are connected to the data buses arranged on a central area provided between the memory mats along a shorter side of a chip.

Four data buses are provided for each memory mat along a shorter side of the memory mat, and these data buses are input in selectors 502#1 to 502#4 provided on central portions of the chip.

Outputs of the selectors 502#1 to 502#4 are connected to data buses drv0 to drv15 provided on an area between the memory mats along a longer side of the chip. The data buses drv0 to drv15 are connected to pads provided on an area between the memory mats 504#3 and 504#4.

FIG. 29 illustrates the correspondence between the data buses drv0 to drv15 shown in FIGS. 28A and 28B and data input/output terminals DQ0 to DQ15.

Referring to FIGS. 28A, 28B and 29, the conventional EDO DRAM can switch the bus width of output data to four bits, eight bits and 16 bits by controlling a mode selection signal.

The selectors 502#1 to 502#4 receive the mode selection signal for switching the bit width and parts of address signals, for selecting necessary data from the four data buses provided in correspondence to each memory mat in response to these control signals.

While the semiconductor memory device is tested with a tester and thereafter regarded as the final product, a multi I/O test is executed so that a plurality of semiconductor devices can be simultaneously tested with a tester having a small number of channels by reducing the number of terminals inputting/outputting data.

Also when executing this multi I/O test, control signals are transmitted to the selectors 502#1 to 502#4 so that four data terminals DQ0 to DQ3 can simultaneously supply data to the data buses provided along the shorter sides of all memory mats.

In this case, the data terminal DQ0 simultaneously supplies data to data buses 0, 4, 2 and 6 provided on the side of the memory mat 504#1, and the data terminal DQ3 simultaneously supplies data to data buses 9, 11, 13 and 15 provided on the side of the memory mat 504#4.

Further, the data terminal DQ1 simultaneously supplies data to data buses 1, 3, 5 and 7 provided on the side of the memory mat 504#1, and the data terminal DQ2 simultaneously supplies data to data buses 8, 10, 12 and 14 provided on the side of the memory mat 504#3.

FIG. 30 is a schematic diagram for illustrating the arrangement of data buses for each mat in the conventional EDO DRAM.

Referring to FIG. 30, data terminals 513 are provided on a central area along the longer side of the chip, and a row and column address buffer 524 is provided at the center of the chip.

The row and column address buffer 524 receives externally supplied address signals A0 to A12, captures addresses and partially decodes the same in response to a control signal /CAS, and outputs signals Y<15:0> and CAD8 to a predecoder zone 554#3.

Data externally supplied to the data terminals 513 reach a selector 502#3 via input buffers 520. The selector 502#3 is supplied with mode selection signals B8E and B16E switching the bit width of the data, and outputs data to write data buses located between the predecoder zone 554#3 and a preamplifier+write driver zone 562#3.

The data output to the write data buses reach write drivers included in the preamplifier+write driver zone 562#3, and the write drivers output the data to the global I/O lines I/O0 to I/O31.

The predecoder zone 554#3 outputs a predecoded address signal YA-YC toward a column decoder 528#3. The column decoder 528#3 responsively selects a corresponding column of a 16-megabit memory mat 504#3 for writing the data therein.

In data reading, data read onto the pairs of global I/O lines I/O0 to I/O 31 from a column selected by the column decoder 528#3 reach preamplifiers included in the preamplifier+write driver zone 562#3, and the preamplifiers output the data to read data buses provided between the predecoder zone 554#3 and the preamplifier+write driver zone 562#3.

The data read on the read data buses are input in the selector 502#3, which in turn selects and outputs the data in response to the mode selection signals B8E and B16E.

The data output from the selector 502#3 reach the data terminals 513 via data output buffers 534. Then the data are read out from the data terminals 513.

In the conventional structure of the data buses, the outputs from the preamplifiers reach the data terminals 513 through the selector 502#3. In other words, bus transfer is performed.

In the selector 502#3, data paths vary with the selected modes and hence critical timing adjustment is necessary. However, such timing adjustment is hard to attain.

FIG. 31 is a diagram for illustrating a multi-bit test in the conventional EDO DRAM.

Referring to FIG. 31, each pair of local I/O lines provided along the shorter side of each mat is divided into four in general. Two modes are employed for the multi-bit test.

In the first mode, a single word line WL and four column selection lines CSL are activated for each mat. Each column selection line outputs 4-bit data, and hence each mat outputs 16-bit data. The 16-bit data is degenerated by wired ORing on a pair of read data lines. Data of 16×4=64 bits are degenerated in the four mats in total.

In the second mode, two word lines WL and four column selection lines CSL are activated for each mat. Thus, each column selection line outputs 8-bit data, and hence each mat outputs 32-bit data. The 32-bit data is degenerated by wired ORing on a pair of read data lines. Data of 32×4=128 bits are degenerated in the four mats in total.

Thus, each mat requires 32 preamplifiers and 32 write drivers accompanying the pairs of global I/O lines.

FIG. 32 is a diagram for illustrating the arrangement of equalizer circuits LEQ for equalizing pairs of local I/O lines of the conventional EDO DRAM and equalizer signals activating the equalizer circuits LEQ.

Referring to FIG. 32, each pair of local I/O lines is divided into four along the shorter side of the memory mat 504#3 and the equalizer circuits LEQ are discretely arranged along the shorter side of the chip, and hence a number of control signal lines are necessary for transmitting control signals LIOEQ<0> to LIOEQ<16> for activating the equalizer circuits LEQ. Thus, the degree of freedom in arrangement of the pairs of global I/O lines is disadvantageously insufficient.

SUMMARY OF THE INVENTION

An object of the present invention is to provide a semiconductor memory device having simple data buses requiring no complicated timing adjustment and capable of reducing the accompanying circuit scale.

Briefly stated, the present invention provides a semiconductor memory device capable of switching the number of terminals inputting/outputting data from/to an external device with a mode switching signal, which comprises a plurality of memory mats, a plurality of data buses and a plurality of input/output circuit zones.

Each of the plurality of memory mats has a rectangular shape. Each memory mat includes a plurality of memory cells arranged in rows and columns, a plurality of pairs of bit lines provided in correspondence to the columns of the plurality of memory cells, and a plurality of pairs of global I/O lines transmitting/receiving data to/from the plurality of pairs of bit lines.

The plurality of data buses are provided in correspondence to each memory mat, and at least partially arranged in parallel with a shorter side of each memory mat. The plurality of input/output circuit zones are provided along the shorter side of each memory mat, and transfer data between the plurality of pairs of global I/O lines and the data buses.

Each input/output circuit zone includes a selection portion selecting data lines corresponding to the plurality of pairs of global I/O lines respectively from a plurality of data lines included in the data buses in response to the mode switching signal.

According to another aspect of the present invention, a semiconductor memory device has first and second multi-bit test modes capable of simultaneously writing test data supplied to a single data input/output pad in a plurality of memory cells, and comprises a memory mat and an input/output circuit zone.

The memory mat includes a plurality of memory cells arranged in rows and columns. The memory mat further includes a first pair of bit lines, provided in correspondence to first column of the memory cells, including first and second bit lines transmitting complementary signals, a second pair of bit lines, provided in correspondence to second column of the memory cells, including a third bit line adjacent to the second bit line and a fourth bit line transmitting complementary signals with the third bit line, a first pair of data lines transmitting data to the first pair of bit lines and a second pair of data lines transmitting data to the second pair of bit lines.

The input/output circuit zone inputs/outputs data in/from the memory mat. The input/output circuit zone includes a first transmission circuit transmitting data supplied to a data input/output pad to the first pair of data lines in first and second multi-bit test modes and a second transmission circuit transmitting the data supplied to the data input/output pad to the second pair of data lines with reverse polarity in the first multi-bit test mode and with straight polarity in the second multi-bit test mode.

Therefore, a principal advantage of the present invention resides in that no complicated timing adjustment is necessary and hence the semiconductor memory device is easy to design and the accompanying circuit scale can be reduced.

Another advantage of the present invention resides in that short-circuiting across alternate bit lines can be detected in a multi-bit test.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 11 is a diagram for illustrating operations of a signal generation circuit 122 shown in FIG. 10;

DESCRIPTION OF THE PREFERRED EMBODIMENTS

Figure 1:
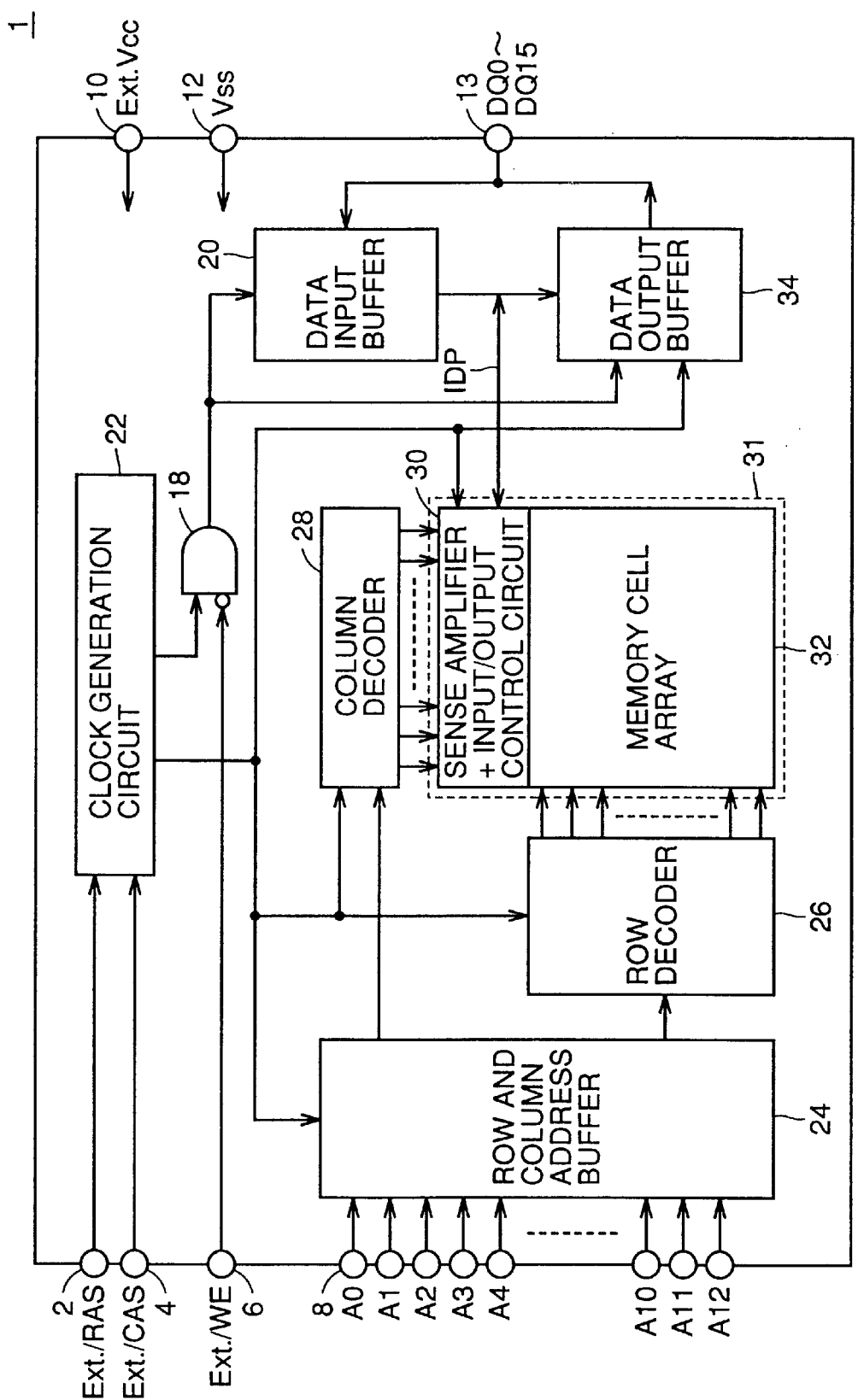
FIG. 1 is a block diagram schematically showing the structure of a semiconductor memory device 1 according to an embodiment of the present invention.

An embodiment of the present invention is now described in detail with reference to the drawings. Referring to the drawings, identical numerals denote the same or corresponding parts.

FIG. 1 is a block diagram schematically showing the structure of a semiconductor memory device 1 according to the embodiment of the present invention.

Referring to FIG. 1, the semiconductor memory device 1 is an EDO DRAM having no memory bank.

The semiconductor memory device 1 comprises control signal input terminals 2 to 6 receiving control signals ext./RAS, ext./CAS and ext./WE respectively, an address input terminal group 8, an input/output terminal group 13 inputting/outputting data signals, a ground terminal 12 supplied with a ground potential Vss, and a power supply terminal 10 supplied with a power supply potential Ext.Vcc.

The semiconductor memory device 1 further comprises a clock generation circuit 22, a row and column address buffer 24, a row decoder 26, a column decoder 28, a memory mat 31, a gate circuit 18, a data input buffer 20 and a data output buffer 34.

The memory mat 31 includes a memory cell array 32 having memory cells arranged in rows and columns, and a sense amplifier+input/output control circuit 30 for inputting/outputting data in/from the memory cell array.

The clock generation circuit 22 generates a control clock corresponding to a prescribed operation mode based on the external row address strobe signal ext./RAS and the external column address strobe signal ext./CAS externally supplied through the control signal input terminals 2 and 4 and controls operations of the overall semiconductor memory device.

The row and column address buffer 24 supplies address signals generated on the basis of externally supplied address signals A0 to A12 to the row decoder 26 and the column decoder 28.

A memory cell of the memory cell array 32 specified by the row decoder 26 and the column decoder 28 transmits/receives data to/from an external device through the input/output terminal group 13 via the sense amplifier+input/output control circuit 30 and the data input buffer 20 or the data output buffer 34.

[Description of Data Bus Structure]

Figure 2:
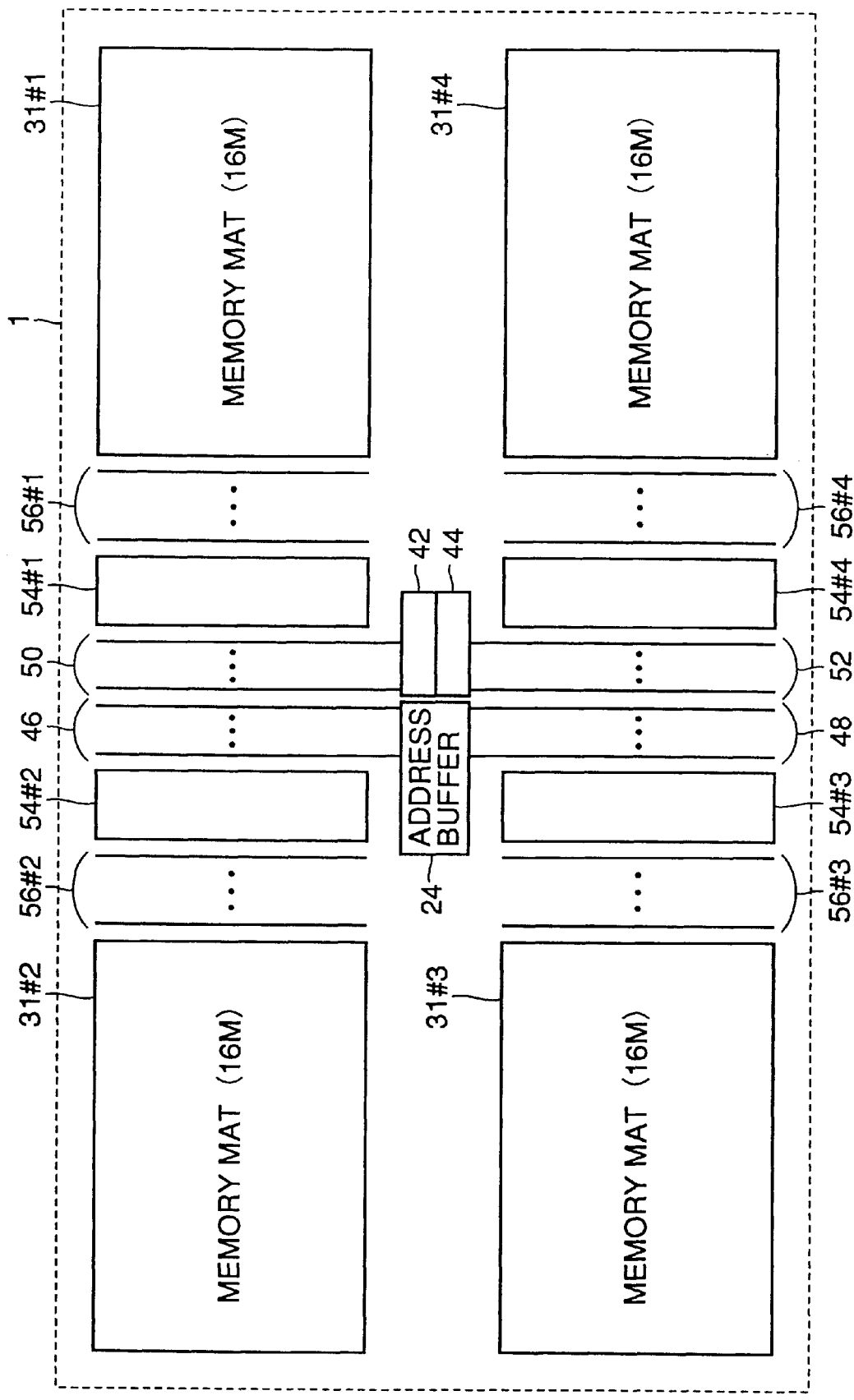
FIG. 2 is a diagram for illustrating the arrangement of memory mats, data buses and an address buffer of the semiconductor memory device 1.

FIG. 2 is a diagram for illustrating the arrangement of memory mats, data buses and the address buffer of the semiconductor memory device 1.

Referring to FIG. 2, the semiconductor memory device 1 includes 16-megabit memory mats 31#1 to 31#4 each having a rectangular shape. The memory mats 31#1 to 31#4 are arranged in two rows and two columns. The address buffer 24 and control circuits 42 and 44 are arranged at the center of the chip.

A central area between the memory mats, provided along a line connecting middle points of opposite longer sides of the chip, is provided with an address bus 46 for transmitting column address system signals to the memory mats 31#1 and 31#2 and an address bus 48 for transmitting column address system signals to the memory mats 31#3 and 31#4.

Thus, the memory mats 31#1 and 31#2 can share the address bus 46 and the memory mats 31#3 and 31#4 can share the address bus 48, whereby no address bus may be provided for each mat and the number of interconnection lines can be reduced dissimilarly to the prior art. Thus, the chip size can be reduced for reducing the cost.

Data input from upper bits of data terminals are written in the memory mats 31#1 and 31#2, the control circuit 42 generates control signals corresponding to upper data of the data terminals, and a control signal bus 50 for transmitting the control signals to the memory mats 31#1 and 31#2 is provided adjacently to the address bus 46.

Data are written in the memory mats 31#3 and 31#4 from lower bits of the data terminals, and a control signal bus 52 for transmitting write control signals to the memory mats 31#3 and 31#4 is provided adjacently to the address bus 46.

Thus, the buses are arranged and the mats are allocated to the data terminals so that the memory mats 31#1 and 31#2 can share the control signal bus 50 and the memory mats 31#3 and 31#4 can share the control signal bus 52, whereby no control signal bus may be provided for each mat and the number of interconnection lines can be reduced dissimilarly to the prior art. Thus, the chip size can be reduced for reducing the cost.

Data buses 56#1 to 56#4 are provided in correspondence to the memory mats 34#1 to 31#4 respectively along shorter sides thereof.

A predecoder zone+selector zone 51#1 is provided between the control signal bus 50 and the data bus 56#1, while a predecoder zone+selector zone 54#2 corresponding to the memory mat 31#2 is provided between the data bus 56#2 and the address bus 46.

A predecoder zone+selector zone 54#3 corresponding to the memory mat 31#3 is provided between the data bus 56#3 and the address bus 48. A predecoder zone+selector zone 54#4 corresponding to the memory mat 31#4 is provided between the data bus 56#4 and the control signal bus 52.

Figure 3:
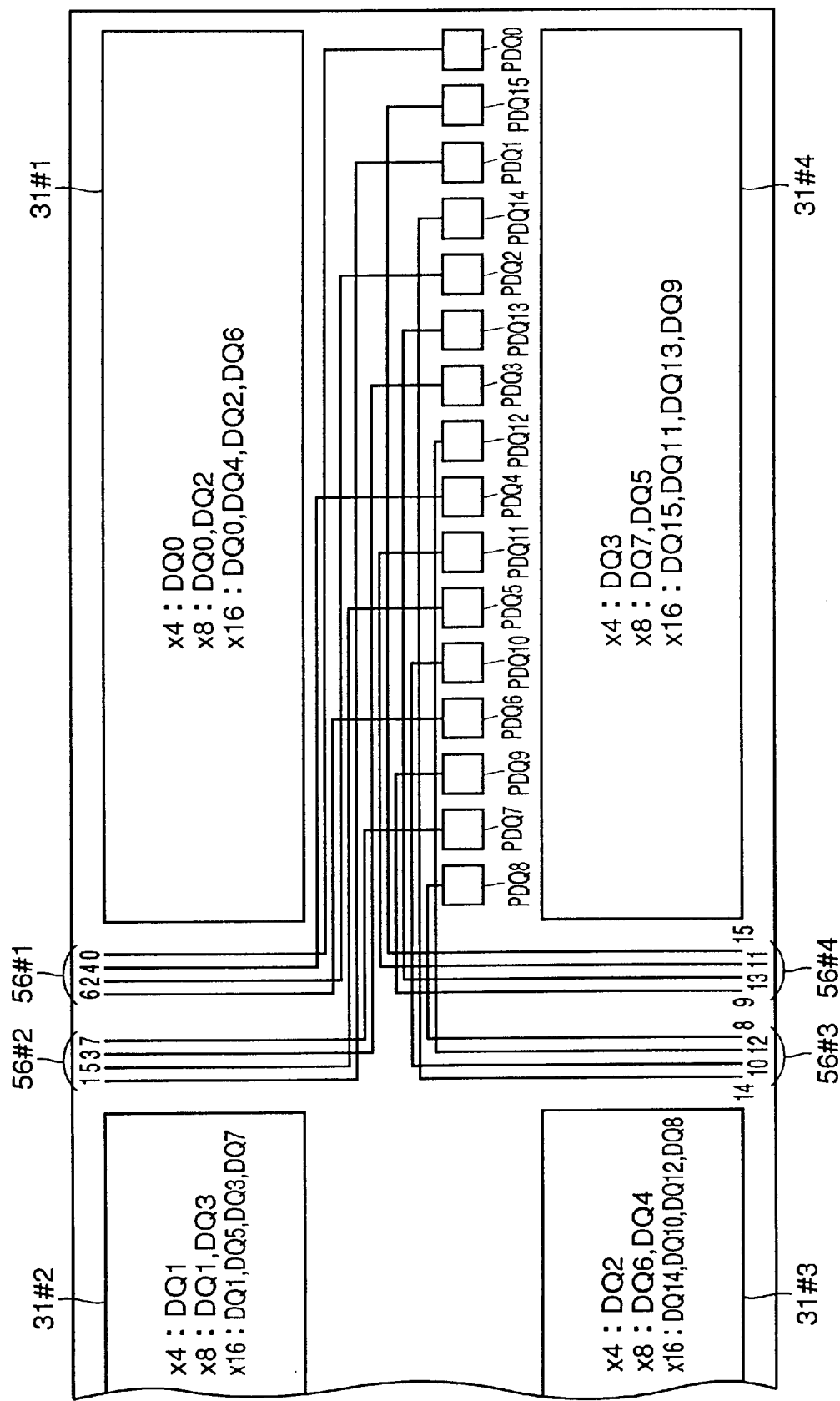
FIG. 3 is a diagram for illustrating the correspondence between the memory mats, the data buses and data input/output terminals.

FIG. 3 is a diagram for illustrating the correspondence between the memory mats, the data buses and the data input/output terminals.

Referring to FIG. 3, the memory mat 31#1 stores data input from terminals DQ0, DQ4, DQ2 and DQ6 in a ×16 mode of the semiconductor memory device for transmitting/receiving 16-bit data.

Pads PDQ0 to PDQ15 corresponding to the terminals DQ0 to DQ15 respectively are provided on an area between the memory mats 31#1 and 31#4.

The data bus 56#1 provided in correspondence to the memory mat 31#1 includes data buses connected to the pads PDQ0, PDQ4, PDQ2 and PDQ6 respectively.

In the ×16 mode, the memory mat 31#2 stores data input from terminals DQ1, DQ5, DQ3 and DQ7. The data bus 56#2 is provided in correspondence to the memory mat 31#2.

The data bus 56#2 includes data buses connected to the pads PDQ1, PDQ5, PDQ3 and PDQ7 respectively.

The memory mat 31#3 preserves data input from terminals DQ14, DQ10, DQ12 and DQ8 in the ×16 mode. The data bus 56#3 is provided in correspondence to the memory mat 31#3.

The data bus 56#3 includes data buses connected to the pads PDQ8, PDQ12, PDQ10 and PDQ14 respectively.

The memory mat 31#4 preserves data input from terminals DQ15, DQ11 and DQ9 in the ×16 mode. The data bus 56#4 is provided in correspondence to the memory mat 31#4.

The data bus 56#4 includes data buses connected to the pads PDQ9, PDQ13, PDQ11 and PDQ15 respectively.

In a ×8 mode, the memory mat 31#1 stores data input from the terminals DQ0 and DQ2. The memory mat 31#2 stores data input from the terminals DQ1 and DQ3. The memory mat 31#3 stores data input from the terminals DQ6 and DQ4. The memory mat 31#4 stores data input from the terminals DQ7 and DQ5.

In a ×4 mode, the memory mat 31#1 stores data input from the terminal DQ0. The memory mat 31#2 stores data input from the terminal DQ1. The memory mat 31#3 stores data input from the terminal DQ2. The memory mat 31#4 stores data input from the terminal DQ3.

Figure 4:
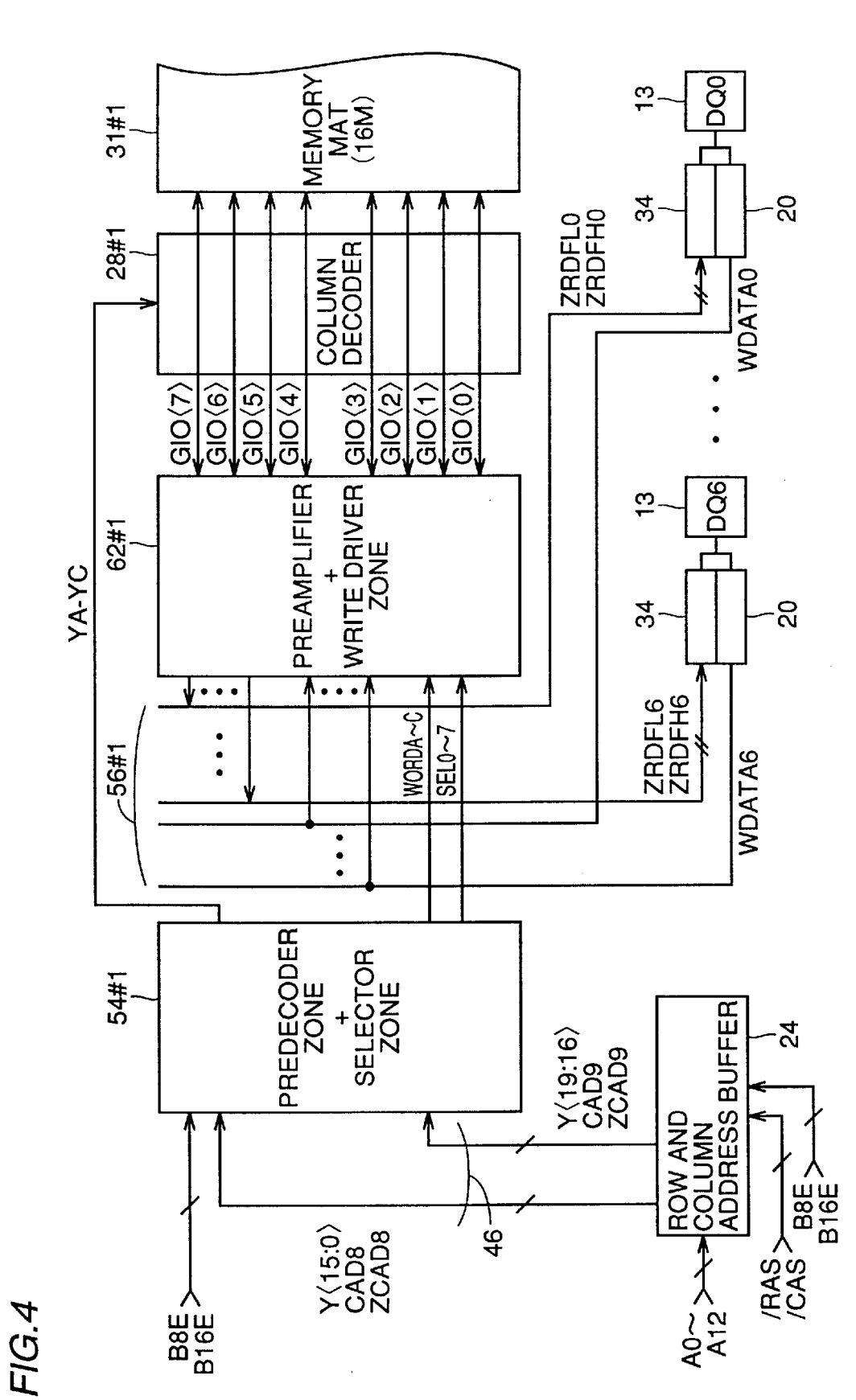
FIG. 4 illustrates the arrangement of the data bus and a selector zone for each memory mat in the semiconductor memory device 1 according to the present invention in detail.

FIG. 4 is a diagram showing the arrangement of the data bus and the selector zone for each memory mat.

FIG. 4 shows the structure of the data bus corresponding to the memory mat 31#1 shown in FIG. 2. Data is input in the input/output terminal 13 arranged on the area between the memory mats 31#1 and 31#4 in FIG. 2.

The input data is transmitted to write data lines WDATA0 to WDATA6 included in the data bus 56#1 through the data input buffer 20. Mode selection signals B8E and B16E are input in the row and column address buffer 24, in addition to the address signals A0 to A12 and control signals /RAS and /CAS.

The row and column address buffer 24 captures the address signals in response to the control signals /RAS and /CAS and outputs partially decoded column-system address signals Y<15:0>, CAD8, ZCAD8, Y<19:16>, CAD9 and ZCAD9.

These column-system address signals are partially converted by the ×4,×8 and ×16 modes set by the mode selection signals B8E and B16E.

The column-system address signals output from the row and column address buffer are supplied in common to the memory mats 3#1 and 31#2 through the address bus 46 shown in FIG. 2. Therefore, the address bus 46 is arranged around an intermediate portion between the memory mats 31#1 and 31#2.

A predecoder zone+selector zone 54#1 provided on an area between the address buffer 24 and the data bus 56#1 receives the column-system address signals output from the row and column address buffer 24 through the address bus 46.

The predecoder zone+selector zone 54#1 further receives the mode selection signals B8E and B16E and outputs a predecoded YA-YC and selection signals SEL0 to SEL7 and WORDA to. WORDC.

A column decoder 28#1 provided adjacently to the memory mat 31#1 receives the predecoded signal YA-YC and activates a column selection line CSL selecting a column of the memory mat 31#1.

A preamplifier+write driver zone 62#1 outputs write data transmitted by the write data lines WDATA0 to WDATA6 to pairs of global I/O lines GIO<0> to GIO<7> in correspondence set by the selection signals SEL0 to SEL7 and WORDA to WORDC. The data are written in the memory cell on the selected column of the memory mat 31#1.

In reading, data read from the memory mat 31#1 onto the pairs of global I/O lines GIO<0> to GIO<7> are read on read data lines ZRDFL0 to ZRDFL6 and ZRDFH0 to ZRDFH6 included in the data bus 56#1 in the correspondence set by the selection signals SEL0 to SEL7 and WORDA to WORDC.

The read data lines ZRDFL0 and ZRDFH0, forming a pair of data buses transmitting complementary data, are connected to the data output buffer 34. The data output buffer 34 amplifies the read data and outputs the amplified data to the input/output terminal 13.

Figure 5:
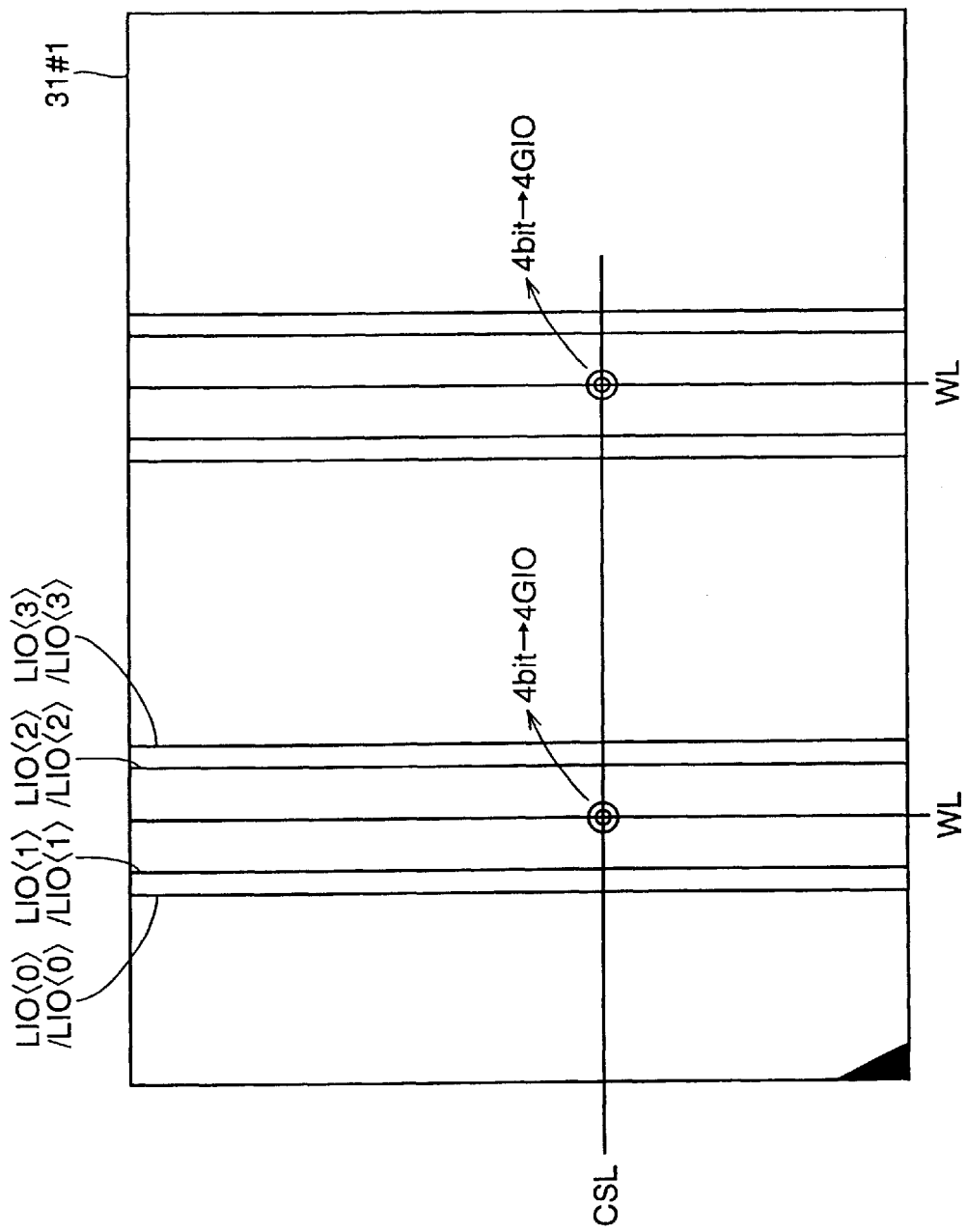
FIG. 5 is a schematic diagram for illustrating operations of a memory mat 31# shown in FIG. 4 in a multi-bit test.

FIG. 5 is a schematic diagram for illustrating operations in a multi-bit test of the memory mat 31#1 shown in FIG. 4.

In the semiconductor memory device according to the present invention, not the conventional multi-bit test described with reference to FIG. 31 but a multi-bit test capable of reducing the circuit scale is employed.

Referring to FIG. 5, one column selection line CSL and two word lines WL are selected per mat in the multi-bit test. Selection switches are provided on the intersections between the column selection line CSL and the word lines WL, and data are read from pairs of local I/O lines positioned around to pairs of global I/O lines.

Each selection switch selects four pairs of local I/O lines LIO<0> to LIO<3> and /LIO<0> to /LIO<3> so that 4-bit data are read therefrom and output to four pairs of global I/O lines. When two selection switches are simultaneously selected, therefore, 8-bit data are simultaneously output to eight pairs of global I/O lines.

In the multi-bit test, preamplifiers included in the preamplifier+write driver zone 62#1 shown in FIG. 4 simultaneously read the 8-bit data read on the pairs of global I/O lines onto the read data lines ZRDFL0 and ZRDFH0.

Only one of the read data lines ZRDFH0 and ZRDFL0 goes low when the data are correctly written, while both read data lines ZRDFH0 and ZRDFL0 go low when the data are abnormally read due to short-circuiting of bit lines or the like. When the preamplifiers output the data to read data buses, the 8-bit data are degenerated by wired ORing.

Figure 31:
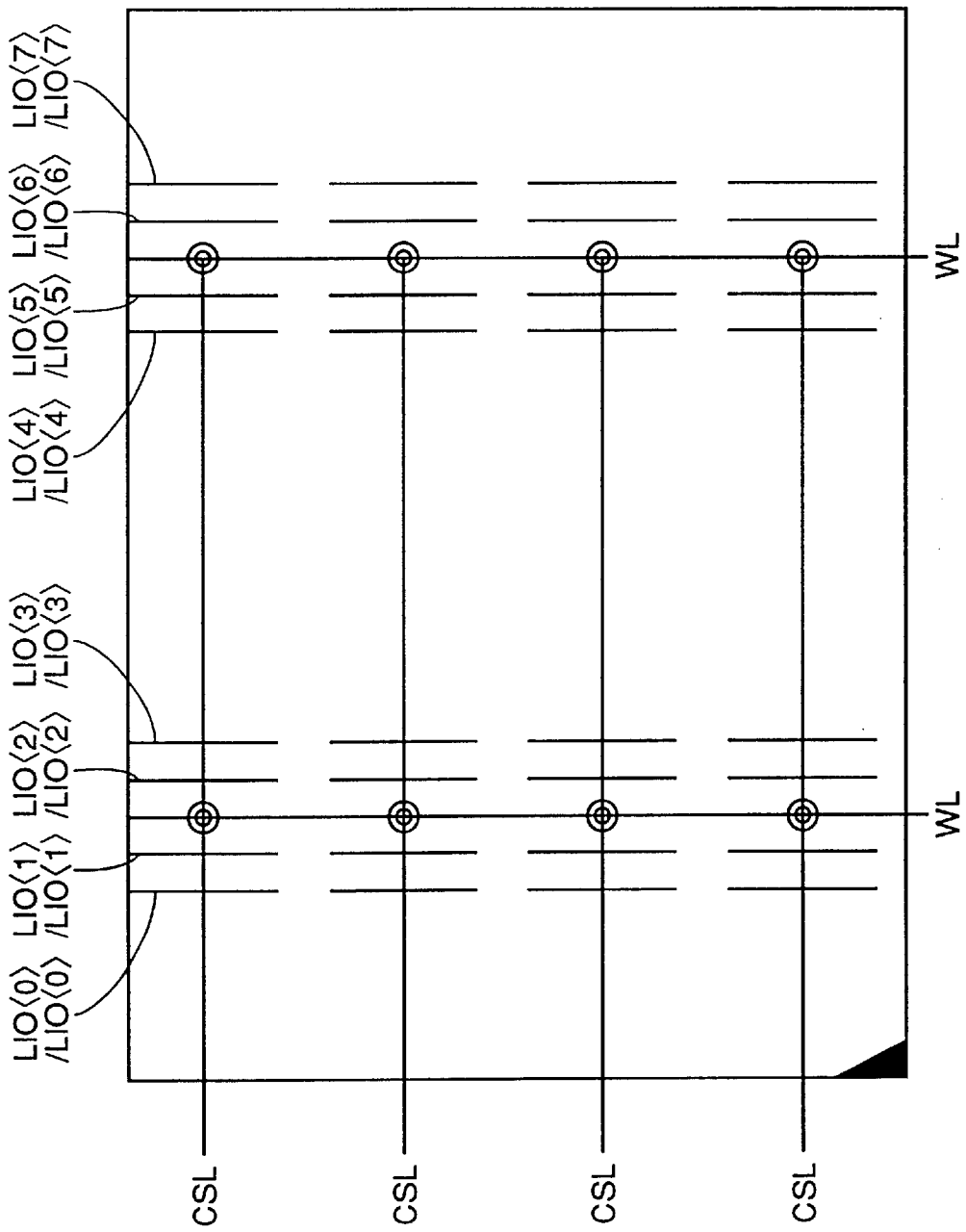
FIG. 31 is a diagram for illustrating a multi-bit test in the conventional EDO DRAM.

In this multi-bit test, only one column selection line is selected and hence the pairs of local I/O lines may not be divided, dissimilarly to the test shown in FIG. 31. Further, the output from each mat is eight bits at the maximum and hence only eight pairs of global I/O lines may be provided. Therefore, each mat may be provided with only eight write drivers WD and eight preamplifiers PA for transmitting/receiving data to/from the pairs of global I/O lines, whereby the circuit scale can be reduced.

Figure 6:
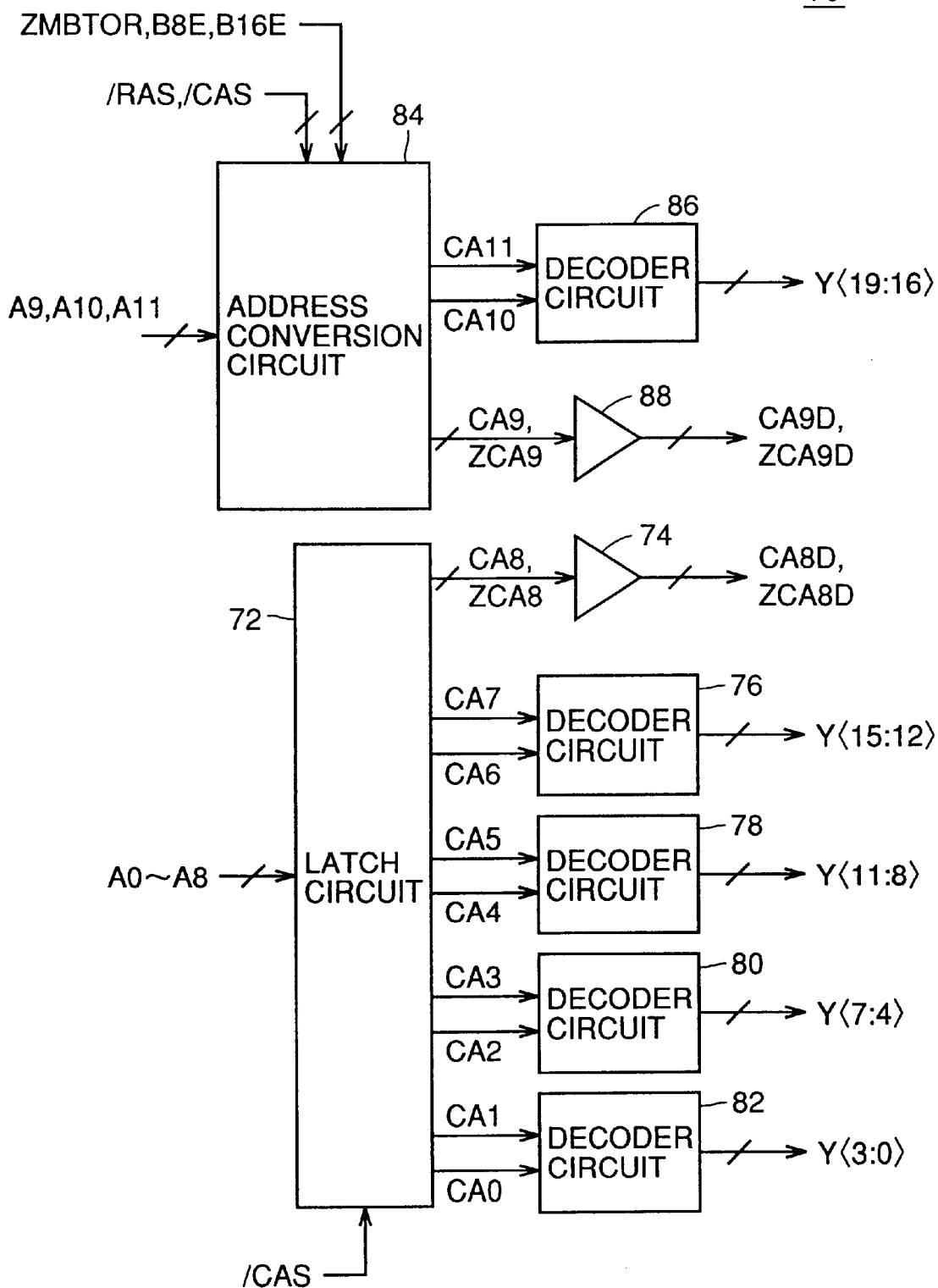
FIG. 6 is a block diagram showing the structure of a column address system signal generation part 70 included in a row and column address buffer 24 shown in FIG. 4.

FIG. 6 is a block diagram showing the structure of a column address system signal generation part 70 included in the row and column address buffer 24 shown in FIG. 4.

Referring to FIG. 6, the signal generation part 70 includes a latch circuit 72 capturing the address signals A0 to A8 in response to the control signal /CAS and outputting column address signals CA0 to CA8 and ZCA0 to ZCA8, a decoder circuit 82 receiving and decoding the column address signals CA0 and CA1 and outputting a signal Y<3:0>, a decoder circuit 80 receiving and decoding the column address signals CA2 and CA3 and outputting a signal Y<7:4>, a decoder circuit 78 receiving and decoding the column address signals CA4 and CA5 and outputting a signal Y<11:8>, a decoder circuit 76 receiving and decoding the column address signals CA6 and CA7 and outputting a signal Y<15:12>, and a buffer circuit 74 receiving and amplifying the column address signals CA8 and ZCA8 and outputting signals CA8D and ZCA8D.

The signal generation part 70 further includes an address conversion circuit 84 capturing the address signals A9, A10 and A11 in response to the control signals /RAS and /CAS in response to setting of the mode selection signals B8E and B16E, a buffer circuit 88 amplifying column address signals CA9 and ZCA9 output from the address conversion circuit 84 and outputting signals CA9D and ZCA9D, and a decoder circuit 86 receiving and decoding column address signals CA10 and CA11 output from the address conversion circuit 84 and outputting a signal Y<19:16>.

Figures 7, 8:
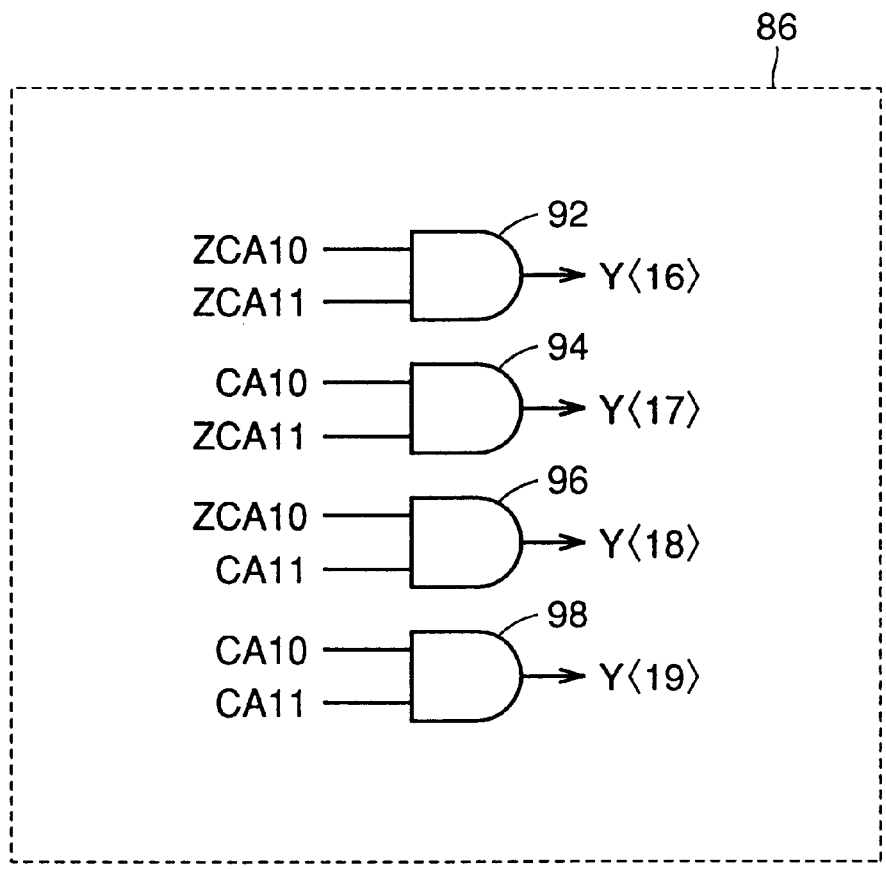
FIG. 7 illustrates correspondence of address conversion in an address conversion circuit 84 shown in FIG. 6.
FIG. 8 is a circuit diagram showing the structure of a decoder circuit 86 shown in FIG. 6.

FIG. 7 illustrates correspondence of address conversion of the address conversion circuit 84 shown in FIG. 6.

Referring to FIGS. 6 and 7, the address conversion circuit 84 recognizes the ×4 mode, the ×8 mode, the ×16 mode and a multi-bit test mode in response to the mode selection signals B8E, B16E and a mode selection signal ZMBTOR and responsively outputs the internal column address signals CA9 to CA11 and ZCA9 to ZCA11.

In the ×4 mode, the internal column address signals CA9 and ZCA9 become the address signals A9 and /A9 captured in response to the control signal /RAS. The internal column address signals CA10 and ZCA10 become the address signals A10 and /A10 captured in response to the control signal /CAS. The internal column address signals CA1 and ZCA11 become the address signals A11 and /A11 captured in response to the control signal /CAS.

In the ×8 mode, the internal column address signals CA9 and ZCA9 become the signals A9 and /A9 respectively, similarly to the ×4 mode. The internal column address signals CA10 and ZCA10 become the address signals A10 and A10 respectively, similarly to the ×4 mode. The internal column address signals CA11 and ZCA11 are both fixed to high levels, dissimilarly to the ×4 mode.

In the ×16 mode, the internal column address signals CA9 and ZCA9 become the address signals A9 and /A9 respectively, similarly to the ×4 and ×8 modes. All of the internal column address signals CA10, CA11, ZCA10 and ZCA11 are fixed to high levels.

In the multi-bit test mode, all of the internal column address signals CA9, ZCA9, CA10, ZCA10, CA11 and ZCA11 are fixed to high levels.

FIG. 8 is a circuit diagram showing the structure of the decoder circuit 86 shown in FIG. 6.

Referring to FIGS. 6 and 8, the address conversion circuit 84 also outputs the column address signals ZCA10 and ZCA11 (not shown) as the internal column address signals complementary to the column address signals CA10 and CA11.

The decoder circuit 86 includes an AND circuit 92 receiving the internal column address signals ZCA10 and ZCA11 and outputting a signal Y<16>, an AND circuit 94 receiving the internal column address signals CA10 and ZCA11 and outputting a signal Y<17>, an AND circuit 96 receiving the internal column address signals ZCA10 and CA11 and outputting a signal Y<18>, and an AND circuit 98 receiving the internal column address signals CA10 and CA11 and outputting a signal Y<19>.

Figure 9:
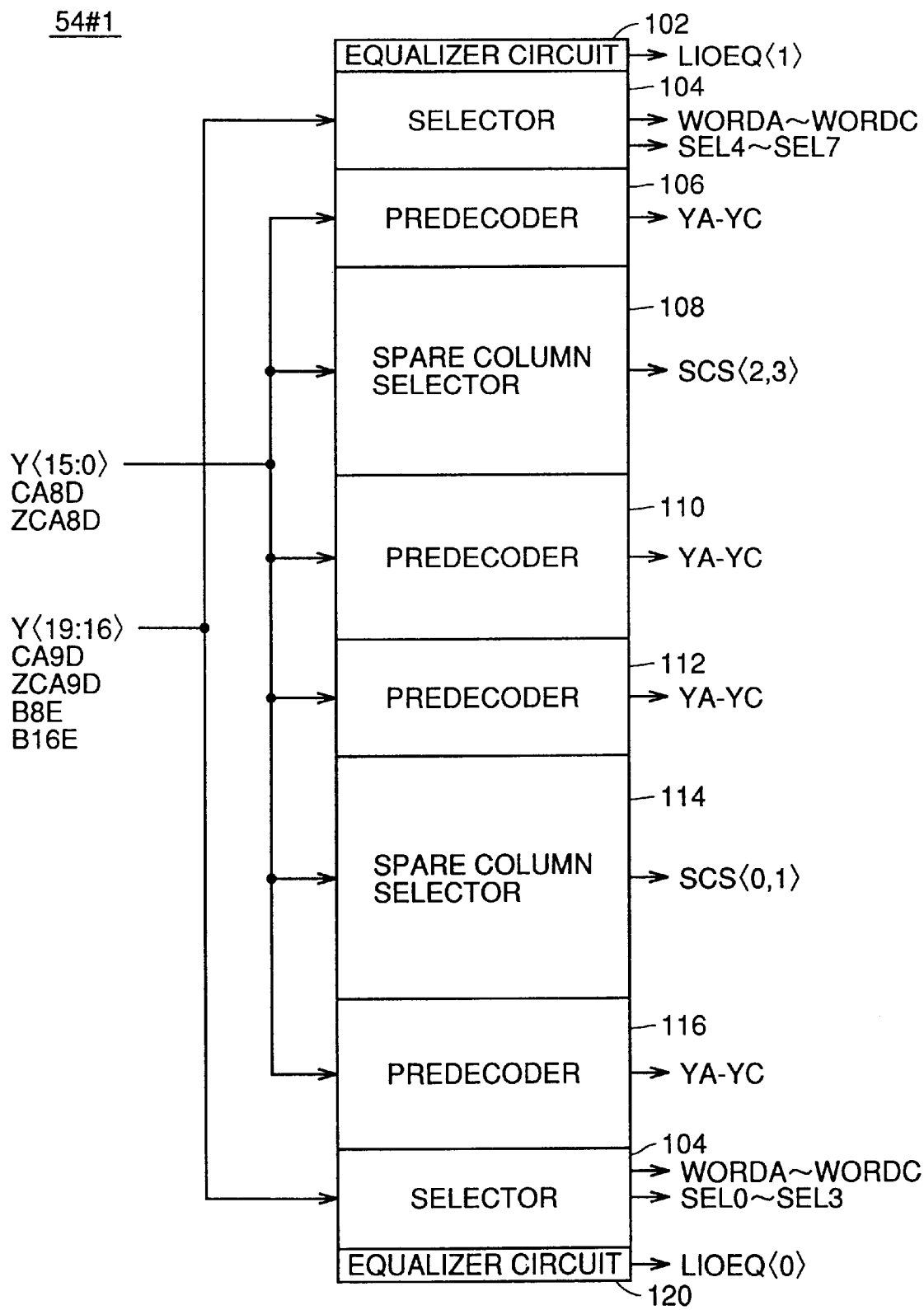
FIG. 9 is a block diagram showing the arrangement of a predecoder zone+selector zone 54#1 shown in FIG. 4.

FIG. 9 is a block diagram showing the arrangement of the predecoder zone+selector zone 54#1 shown in FIG. 4.

Referring to FIGS. 4 and 9, the predecoder zone+selector zone 54#1 includes a selector 104 receiving the mode selection signals B8E and B16E and the signals Y<19:16>, CA9D and ZCA9D, predecoders 106, 110, 112 and 116 and spare column selectors 108 and 114 receiving the signals Y<15:0>, CA8D and ZCA8D from the row and column address buffer 24, and equalizer circuits 120 and 102 located on both ends of the predecoder zone+selector zone 54#1 for outputting equalizer signals LIOEQ<0> and LIOEQ<1> for the pairs of local I/O lines.

The selector 104 outputs the selection signals SEL0 to SEL7 and WORDA to WORDC. The selector 104 is divided into two parts, and the part provided adjacently to the equalizer circuit 120 outputs the selection signals SEL0 to SEL3 and WORDA to WORDC. The part provided adjacently to the equalizer circuit 102 outputs the selection signals SEL4 to SEL7 and WORDA to WORDC.

The predecoders 106, 110, 112 and 116 predecode supplied column address system signals and output the signal YA-YC. The spare column selectors 108 and 114 output control signals SCS<2,3> and SCS<0,1> for column substitution when the memory mat has a column including a defective memory cell.

Figure 10:
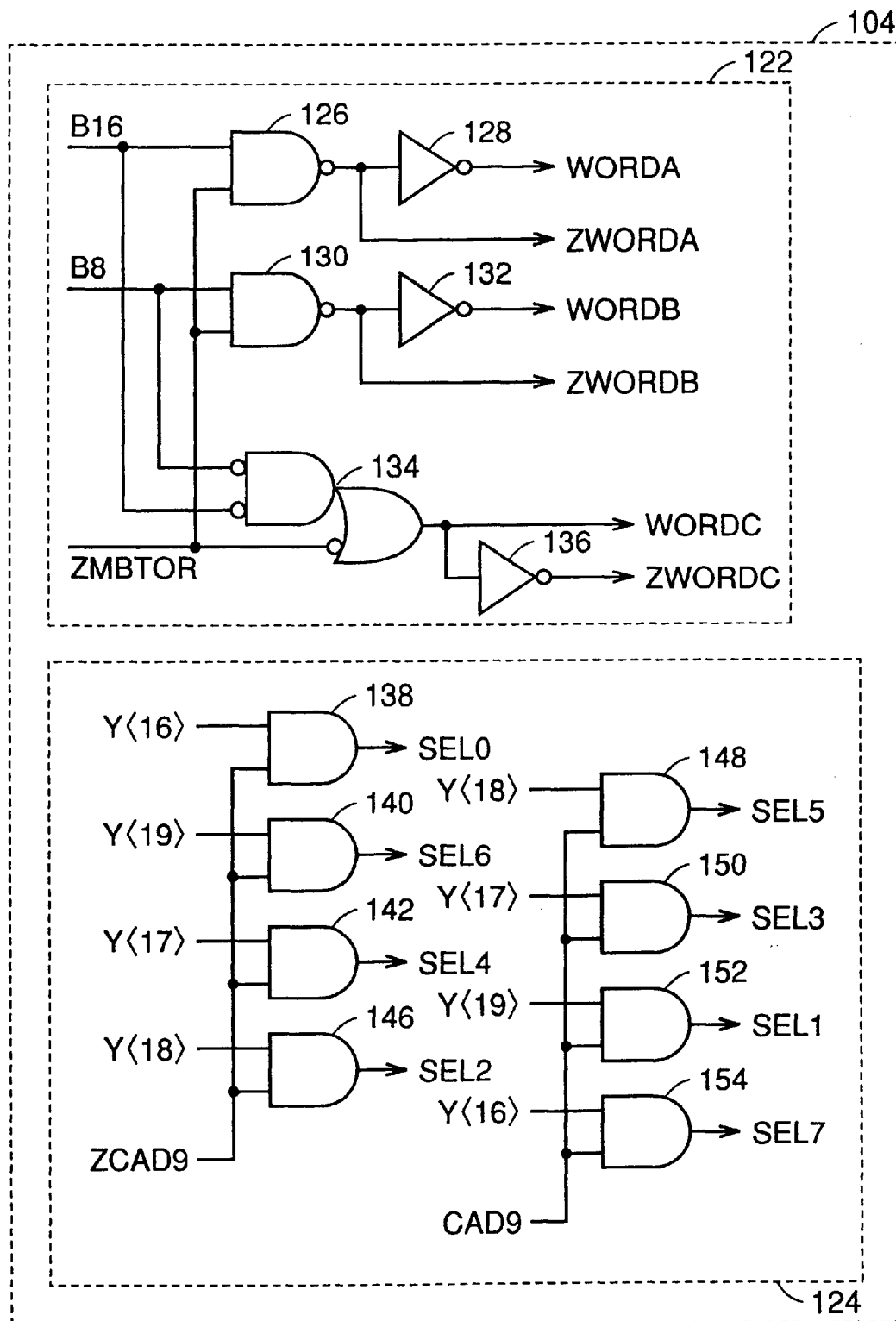
FIG. 10 is a circuit diagram showing the structure of a selector 104 shown in FIG. 9.

FIG. 10 is a circuit diagram showing the structure of the selector 104 shown in FIG. 9.

Referring to FIG. 10, the selector 104 includes a signal generation circuit 122 outputting the selection signals WORDA to WORDC and selection signals ZWORDA to ZWORDC from the mode selection signals B8E, B16E and ZMBTOR and a signal generation circuit 124 outputting the selection signals SEL0 to SEL7 from the signal Y<19:16>.

The signal generation circuit 122 includes a NAND circuit 126 receiving the mode selection signal B16 and the mode selection signal ZMBTOR going high in the modes other than the multi-bit test mode and outputting the selection signal ZWORDA, an inverter 128 receiving and inverting the selection signal ZWORDA and outputting the selection signal WORDA, a NAND circuit 130 receiving the mode selection signals B8 and ZMBTOR and outputting the selection signal ZWORDB, an inverter 132 receiving and inverting the selection signal ZWORDB and outputting the selection signal WORDB, a gate circuit 134 receiving the mode selection signals B8, B16 and ZMBTOR and outputting the selection signal WORDC, and an inverter 136 receiving and inverting the selection signal WORDC and outputting the selection signal ZWORDC.

The signal generation circuit 124 includes an AND circuit 138 receiving the signals CAD9 and Y<16> and outputting the selection signal SEL0, an AND circuit 140 receiving the signals CAD9 and Y<19> and outputting the selection signal SEL6, an AND circuit 152 receiving the signals CAD9 and Y<17> and outputting the selection signal SEL4, and an AND circuit 146 receiving the signals CAD9 and Y<18> and outputting the selection signal SEL2.

The signal generation circuit 124 further includes an AND circuit 148 receiving the signals CAD9 and Y<18> and outputting the selection signal SEL5, an AND circuit 150 receiving the signals CAD9 and Y<17>and outputting the selection signal SEL3, an AND circuit 152 receiving the signals CAD9 and Y<19> and outputting the selection signal SEL1, and an AND circuit 154 receiving the signals CAD9 and Y<16> and outputting the selection signal SEL7.

FIG. 11 is a diagram for illustrating operations of the signal generation circuit 122 shown in FIG. 10.

First, the relation between the mode selection signals and the selected modes is described with reference to FIG. 11. When the mode selection signal B16 is high, the mode selection signal B8 is low and the mode selection signal ZMBTOR is high, the ×16 mode is selected.

When the mode selection signal B16 is low, the mode selection signal B8 is high and the mode selection signal ZMBTOR is high, the ×8 mode is selected.

When the mode selection signals B16 and B8 are low and the mode selection signal ZMBTOR is high, the ×4 mode is selected.

When performing the multi-bit test, the mode selection signal ZMBTOR is set low regardless of the values of the mode selection signals B16 and B8.

The relation between the selection signals WORDA to WORDC and the respective modes is now described. In the ×16 mode, the selection signal WORDA is set high and the selection signals WORDB and WORDC are set low.

In the ×8 mode, the selection signal WORDB is set high and the selection signals WORDA and WORDC are set low. In the ×4 mode, the selection signal WORDC is set high and the selection signals WORDA and WORDB are set low.

When performing the multi-bit test, the selection signals are set similarly to the ×4 mode. In other words, the selection signal WORDC is set high and the selection signals WORDA and WORDB are set low.

Figure 12:
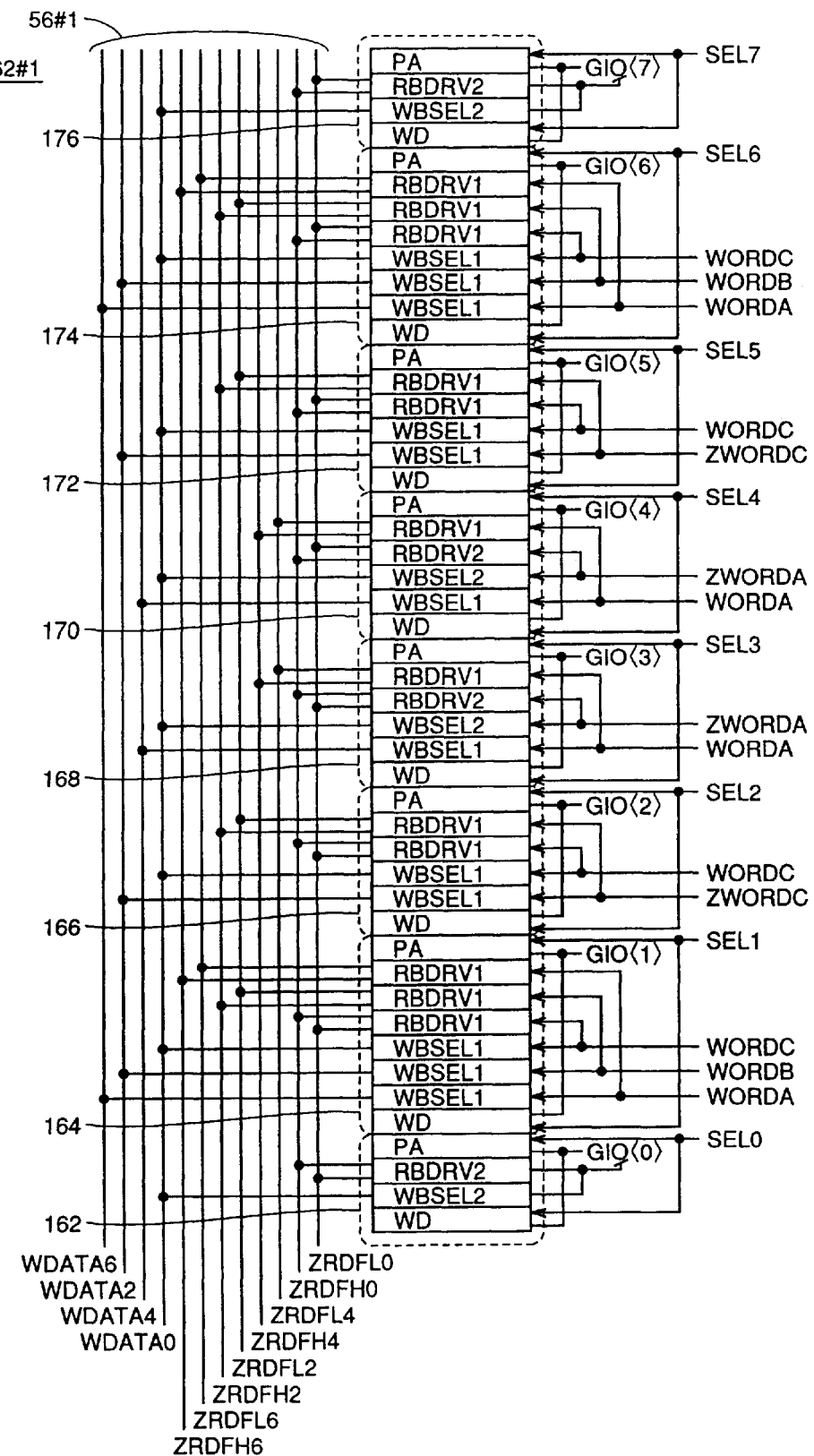
FIG. 12 is a block diagram showing the structure of a preamplifier+write driver zone 62#1 shown in FIG. 4.

FIG. 12 is a block diagram showing the structure of the preamplifier+write driver zone 62#1 shown in FIG. 4.

Referring to FIG. 12, the preamplifier+write driver zone 62#1 changes the correspondence between the data bus 56#1 and the pairs of global I/O lines GIO<0> to GIO<7> in response to setting of the selection signals SEL0 to SEL7 and WORDA to WORDC.

The data bus 56#1 includes write data lines WDATA0, WDATA4, WDATA2 and WDATA6 and read data lines ZRDFL0, ZRDFH0, ZRDFL4, ZRDFH4, ZRDFL2, ZRDFH2, ZRDFL6 and ZRDFH6.

The preamplifier+write driver zone 62#1 includes a block 162 provided in correspondence to the pair of global I/O lines GIO<0>, a block 164 provided in correspondence to the pair of global I/O lines GIO<1>, a block 166 provided in correspondence to the pair of global I/O lines GIO<2>, and a block 168 provided in correspondence to the pair of global I/O lines GIO<3>.

The preamplifier+write driver zone 62#1 further includes a block 170 provided in correspondence to the pair of global I/O lines GIO<4>, a block 172 provided in correspondence to the pair of global I/O lines GIO<5>, a block 174 provided in correspondence to the pair of global I/O lines GIO<6>, and a block 176 provided in correspondence to the pair of global I/O lines GIO<7>.

The block 162 includes a write buffer selector WBSEL2 receiving write data from the write data line WDATA0, a write driver WD receiving an output of the write buffer selector WBSEL2 and driving the pair of global I/O lines GIO<0>, a preamplifier PA amplifying data read on the pair of global I/O lines GIO<0>, and a read bus driver RBDRV2 outputting an output from the preamplifier PA to the read data lines ZRDFL0 and ZRDFH0. The preamplifier PA and the write driver WD included in the block 162 are activated in response to the selection signal SEL0.

The block 164 includes three write bus selectors WBSEL1 capturing data transmitted to the write data lines WDATA6, WDATA2 and WDATA0 in response to the selection signals WORDA, WORDB and WORDC respectively, a write driver WD receiving outputs of the three write bus selectors WBSEL1 and outputting write data to the pair of global I/O lines GIO<1>, a preamplifier PA amplifying the data read on the pair of global I/O lines GIO<1>, a read bus driver RBDRV1 outputting an output of the preamplifier PA to the read data lines ZRDFL6 and ZRDFH6 in response to the selection signal WORDA, a read bus driver RBDRV1 outputting the output of the preamplifier PA to the read data lines ZRDFL2 and ZRDFH2 in response to the selection signal WORDB, and a read bus driver RBDRV1 outputting the output of the preamplifier PA to the read data lines ZRDFL0 and ZRDFH0 in response to the selection signal WORDC. The preamplifier PA and the write driver WD included in the block 164 are activated in response to the selection signal SEL1.

The block 166 includes two write bus selectors WBSEL1 capturing data transmitted to the write data lines WDATA2 and WDATA0 in response to the selection signals ZWORDC and WORDC, a write driver WD receiving outputs of the two write bus selectors and outputting write data to the pair of global I/O lines GIO<2>, a preamplifier PA receiving and amplifying the data read on the pair of global I/O lines GIO<2>, a read bus driver RBDRV1 outputting an output of the preamplifier PA to the read data lines ZRDFL0 and ZRDFH0 in response to the selection signal WORDC and a read bus driver RBDRV1 outputting the output of the preamplifier PA to the read data lines ZRDFL2 and ZRDFH2 in response to the selection signal ZWORDC. The preamplifier PA and the write driver WD included in the block 166 are activated in response to the selection signal SEL2.

The block 168 includes write bus selectors WBSEL1 and WBSEL2 capturing data transmitted to the write data lines WDATA4 and WDATA0 in response to the selection signals WORDA and ZWORDA respectively, a write driver WD receiving outputs of the write bus selectors WBSEL1 and WBSEL2 and outputting write data to the pair of global I/O lines GIO<3>, a preamplifier PA receiving and amplifying the data read on the pair of global I/O lines GIO<3>, a read bus driver RBDRV1 outputting an output of the preamplifier PA to the read data lines ZRDFL4 and ZRDFH4 in response to the selection signal WORDA and a read bus driver RBDRV2 outputting the output of the preamplifier PA to the read data lines ZRDFL0 and ZRDFH0 in response to the selection signal ZWORDA. The preamplifier PA and the write driver WD included in the block 168 are activated in response to the selection signal SEL3.

The block 170 includes write bus selectors WBSEL1 and WBSEL2 capturing data transmitted to the write data lines WDATA4 and WDATA0 in response to the selection signals WORDA and ZWORDA respectively, a write driver WD receiving outputs of the write bus selectors WBSEL1 and WBSEL2 and outputting write data to the pair of global I/O lines GIO<4>, a preamplifier PA receiving and amplifying the data read on the pair of global I/O lines GIO<4>, a read bus driver RBDRV1 outputting an output of the preamplifier PA to the read data lines ZRDFL4 and ZRDFH4 in response to the selection signal WORDA and a read bus driver RBDRV2 outputting the output of the preamplifier PA to the read data lines ZRDFL0 and ZRDFH0 in response to the selection signal ZWORDA. The preamplifier PA and the write driver WD included in the block 170 are activated in response to the selection signal SEL4.

The block 172 includes two write bus selectors WBSEL1 capturing data transmitted to the write data lines WDATA2 and WDATA0 in response to the selection signals ZWORDC and WORDC respectively, a write driver WD receiving outputs of the two write bus selectors and outputting write data to the pair of global I/O lines GIO<5>, a preamplifier PA receiving and amplifying the data read on the pair of global I/O lines GIO<5>, a read bus driver RBDRV1 outputting an output of the preamplifier PA to the read data lines ZRDFL0 and ZRDFH0 in response to the selection signal WORDC and a read bus driver RBDRV1 outputting the output of the preamplifier PA to the read data lines ZRDFL2 and ZRDFH2 in response to the selection signal ZWORDC. The preamplifier PA and the write driver WD included in the block 172 are activated in response to the selection signal SEL5.

The block 174 includes three write bus selectors WBSEL1 capturing data transmitted to the write data lines WDATA6, WDATA2 and WDATA0 in response to the selection signals WORDA, WORDB and WORDC respectively, a write driver WD receiving outputs of the three write bus selectors WBSEL1 and outputting write data to the pair of global I/O lines GIO<6>, a preamplifier PA amplifying the data read on the pair of global I/O lines GIO<6>, a read bus driver RBDRV1 outputting an output of the preamplifier PA to the read data lines ZRDFL6 and ZRDFH6 in response to the selection signal WORDA, a read bus driver RBDRV1 outputting the output of the preamplifier PA to the read data lines ZRDFL2 and ZRDFH2 in response to the selection signal WORDB, and a read bus driver RBDRV1 outputting the output of the preamplifier PA to the read data lines ZRDFL0 and ZRDFH0 in response to the selection signal WORDC. The preamplifier PA and the write driver WD included in the block 174 are activated in response to the selection signal SEL6.

The block 176 includes a write buffer selector WBSEL2 receiving write data from the write data line WDATA0, a write driver WD receiving an output of the write buffer selector WBSEL2 and driving the pair of global I/O lines GIO<7>, a preamplifier PA amplifying data read on the pair of global I/O lines GIO<7>, and a read bus driver RBDRV2 outputting an output of the preamplifier PA to the read data lines ZRDFL0 and ZRDFH0. The preamplifier PA and the write driver WD included in the block 176 are activated in response to the selection signal SEL7.

[Flow of Data Writing]

Figure 13:
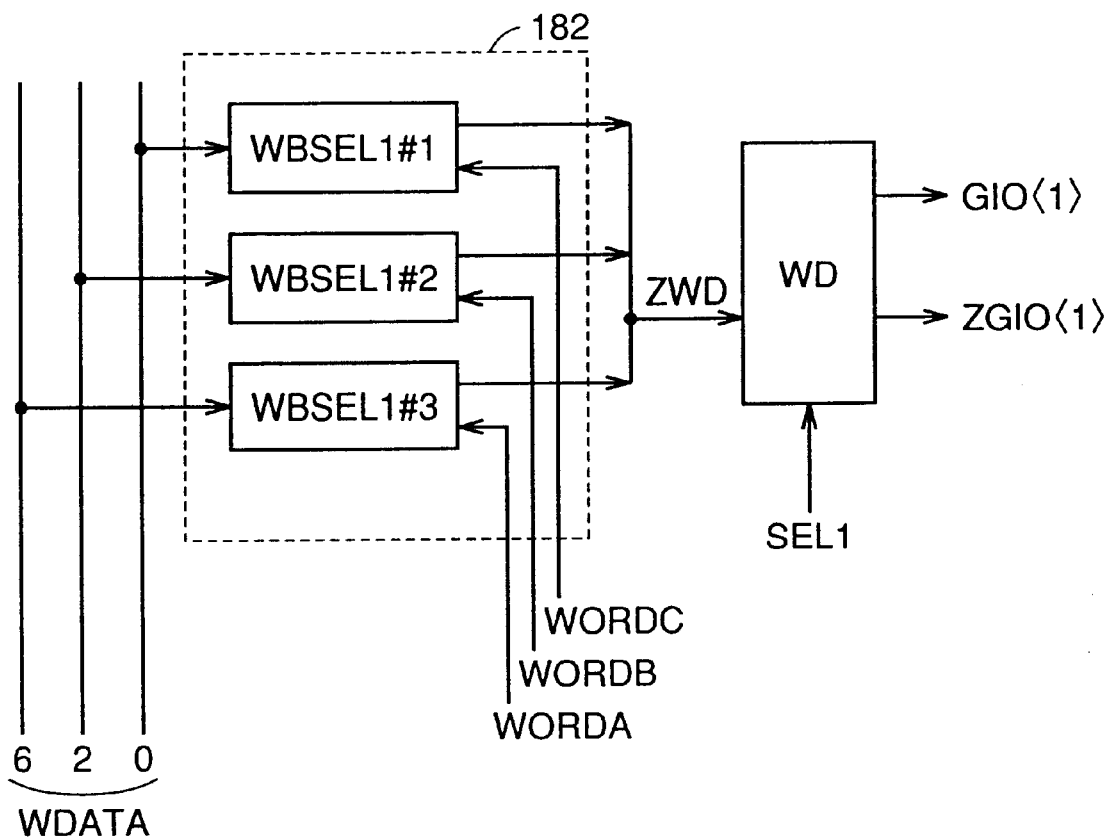
FIG. 13 illustrates the structure of a block 164 related to writing in FIG. 12 for illustrating the flow of data from a write data bus to a pair of global I/O lines.

FIG. 13 shows a structure, related to writing, of the block 164 shown in FIG. 12 in order to illustrate the flow of data from the write data bus to the pair of global I/O lines.

Referring to FIG. 13, write data transmitted by the write data lines WDATA0, WDATA2 and WDATA6 are input in a selection circuit 182.

The selection circuit 182 includes a write bus selector WBSEL1#1 outputting the write data transmitted by the write data line WDATA0 as a signal ZWD when the selection signal WORDC is activated, a write bus selector WBSEL1#2 outputting the write data transmitted by the write data line WDATA2 as the signal ZWD when the selection signal WORDB is activated, and a write bus selector WBSEL1#3 outputting the write data transmitted by the write data line WDATA6 as the signal ZWD when the selection signal WORDA is activated.

The write driver WD included in the block 164 outputs the signal ZWD output from the selection circuit 182 to the pair of global I/O lines GIO<1> and ZGIO<1> as complementary write data when the selection signal SEL1 is activated.

Figure 14:
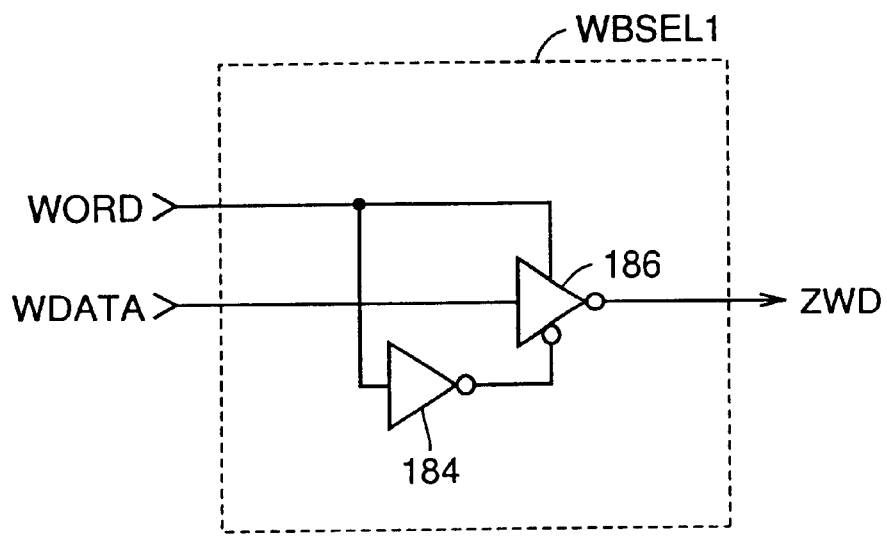
FIG. 14 is a circuit diagram showing the structure of each write bus selector WBSEL1 shown in FIGS. 12 and 13.

FIG. 14 is a circuit diagram showing the structure of each write bus selector WBSEL1 shown in FIGS. 12 and 13.

Referring to FIG. 14, the write bus selector WBSEL1 includes an inverter 184 receiving and inverting a selection signal WORD, and a clocked inverter 186 inverting write data transmitted onto a write data line WDATA and outputting the inverted data as the signal ZWD when the selection signal WORD is activated in response to the selection signal WORD and an output of the inverter 184.

The selection signal WORD corresponds to the selection signals WORDA to WORDC and ZWORDA to ZWORDC shown in FIG. 12, and the write data line WDATA corresponds to the write data lines WDATA0, WDATA4, WDATA2 and WDATA6 shown in FIG. 12.

Figures 15, 16:
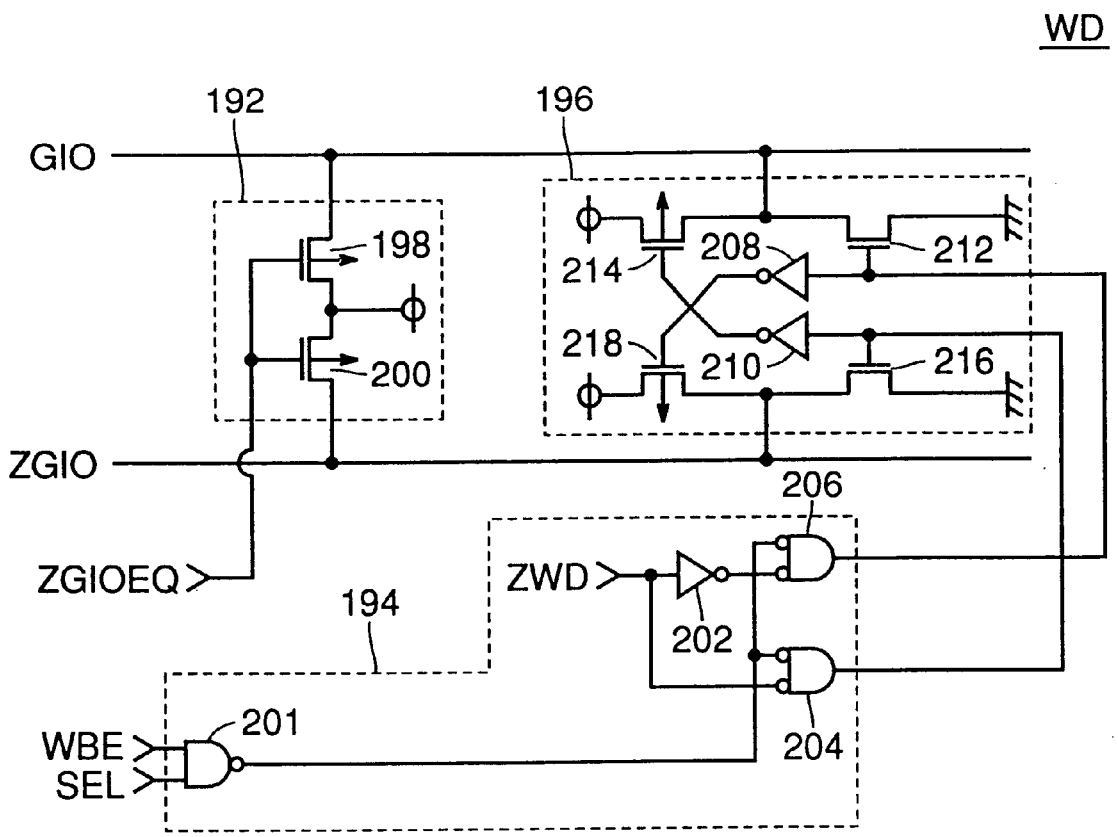
FIG. 15 is a circuit diagram showing the structure of each write driver WD shown in FIGS. 12 and 13.
FIG. 16 is a diagram for illustrating the correspondence between pairs of global I/O lines GIO<0> to GIO<7> and write data lines in respective operation modes.

FIG. 15 is a circuit diagram showing the structure of each write driver WD shown in FIGS. 12 and 13.

Referring to FIG. 15, the write driver WD includes an equalizer circuit 192 precharging global I/O lines GIO and ZGIO to the power supply potential in response to an equalizer signal ZGIOEQ, a gate circuit 194 transmitting the signal ZWD output from the write bus selector in response to an enable signal WBE and a selection signal SEL, and an amplifier circuit 196 driving the global I/O lines GIO and ZGIO in response to an output of the gate circuit 194.

The gate circuit 194 includes a NAND circuit 201 receiving the enable signal WBE and the selection signal SEL, an inverter 202 receiving and inverting the signal ZWD output from the write bus selector, a NOR circuit 204 receiving an output of the NAND circuit 201 and the signal ZWD, and a NOR circuit 206 receiving outputs of the inverter 202 and the NAND circuit 201.

The equalizer circuit 192 includes a P-channel MOS transistor 198 connected between a power supply node and the global I/O line GIO for receiving the equalizer signal ZGIOEQ in its gate, and a P-channel MOS transistor 200 connected between the power supply node and the global I/O line ZGIO for receiving the equalizer signal ZGIOEQ in its gate.

The amplifier circuit 196 includes an inverter 210 receiving and inverting an output of the NOR circuit 204, an inverter 208 receiving and inverting an output of the NOR circuit 206, an N-channel MOS transistor 216 connected between a ground node and the global I/O line ZGIO for receiving the output of the NOR circuit 204 in its gate, a P-channel MOS transistor 218 connected between a power supply node and the global I/O line ZGIO for receiving an output of the inverter 208 in its gate, an N-channel MOS transistor 212 connected between the ground node and the global I/O line GIO for receiving the output of the NOR circuit 206 in its gate, and a P-channel MOS transistor 214 connected between the power supply node and the global I/O line GIO for receiving an output of the inverter 210 in its gate.

Among the selection signals SEL0 to SEL7 shown in FIG. 12, a corresponding signal is input in the selection signal SEL.

FIG. 16 is a diagram for illustrating the correspondence between the pairs of global I/O lines GIO<0> to GIO<7> and the write data lines in the respective operation modes.

Referring to FIGS. 12 and 16, the block 162 writes the data transmitted by the write data line WDATA0 in the pair of global I/O lines in all of the ×4, ×8 and ×16 modes and the multi-bit test mode.

The block 164 writes the data transmitted by the write data line WDATA0, the write data line WDATA2 and the write data line WDATA6 in the pair of global I/O lines GIO<1> in the ×4 mode, the ×8 mode and the ×16 mode respectively.

The block 166 writes the data transmitted by the write data line WDATA0, the write data line WDATA2 and the write data line WDATA2 in the pair of global I/O lines GIO<2> in the ×4 mode, the ×8 mode and the ×16 mode respectively.

The block 168 writes the data transmitted by the write data line WDATA0, the write data line WDATA0 and the write data line WDATA4 in the pair of global I/O lines GIO<3> in the ×4 mode, the ×8 mode and the ×16 mode respectively.

The block 170 writes the data transmitted by the write data line WDATA0, the write data line WDATA0 and the write data line WDATA4 in the pair of global I/O lines GIO<4> in the ×4 mode, the ×8 mode and the ×16 mode respectively.

The block 172 writes the data transmitted by the write data line WDATA0, the write data line WDATA2 and the write data line WDATA2 in the pair of global I/O lines GIO<5> in the ×4 mode, the ×8 mode and the ×16 mode respectively.

The block 174 writes the data transmitted by the write data line WDATA2, the write data line WDATA2 and the write data line WDATA6 in the pair of global I/O lines GIO<6> in the ×4 mode, the ×8 mode and the ×16 mode respectively.

The block 174 writes the data transmitted by the write data line WDATA0 in the pair of global I/O lines GIO<7> in all of the ×4 mode, the ×8 mode and the ×16 mode.

When executing the multi-bit test, the blocks 162 to 172 simultaneously write the data transmitted by the write data line WDATA0 in the pairs of global I/O lines GIO<0> to GIO<7>.

Figure 17:
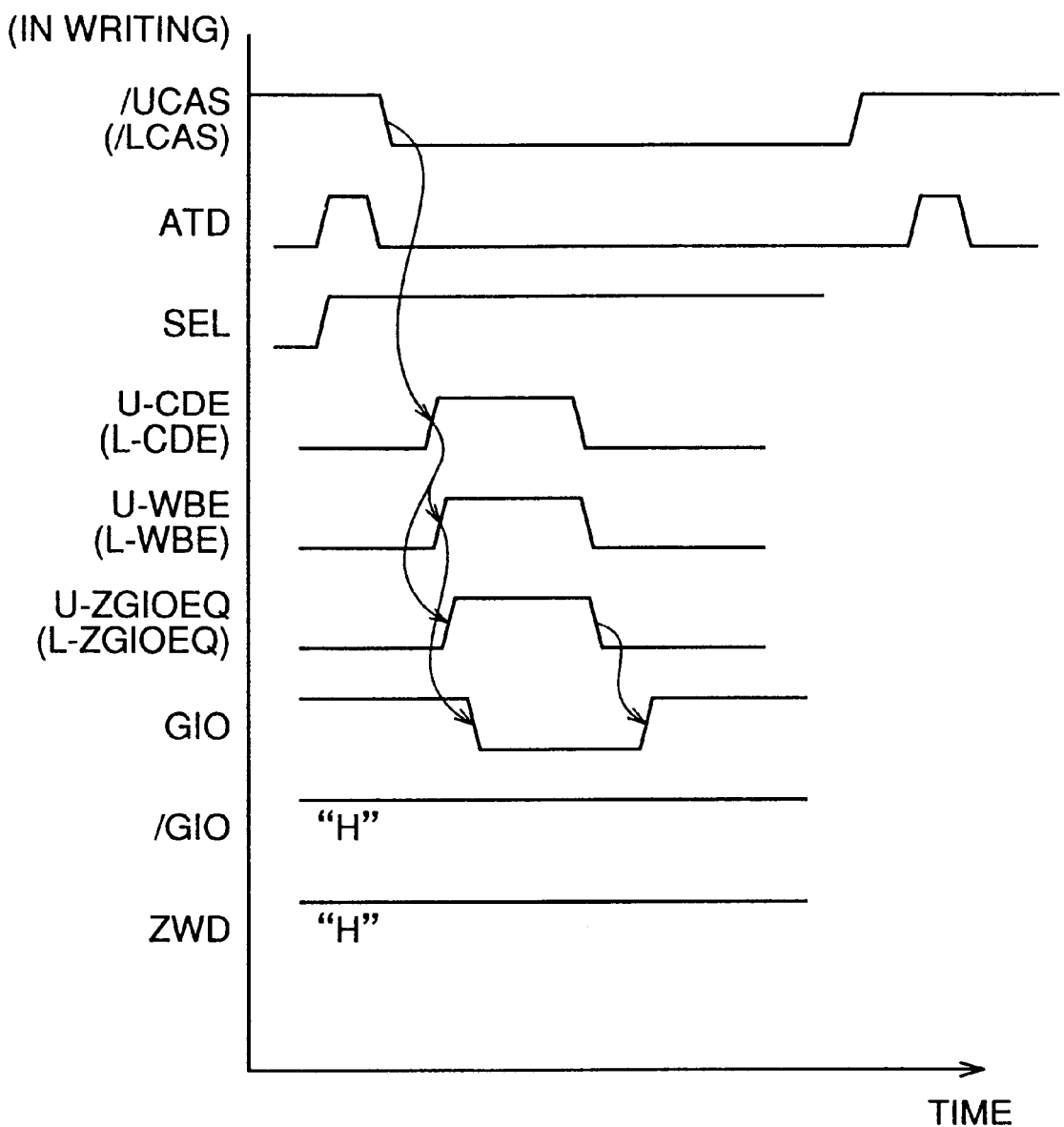
FIG. 17 is an operation waveform diagram for illustrating operations in writing.

FIG. 17 is an operation waveform diagram for illustrating operations in writing.

Referring to FIG. 17, a pulse appears on a signal ATD when the address changes. The selection signal SEL generated through the address conversion circuit 84 and the decoder circuit 86 shown in FIG. 6 and the selector 104 shown in FIG. 9 is activated.

Signals U_CDE and L_CDE are activated in response to fall of control signals /UCAS and /LCAS indicating input of a column address, and signals U_WBE and L_WBE are responsively activated.

The global I/O line GIO is released from equalization by equalizer signals U_ZGIOEQ and L_ZGIOEQ and data is read on the global I/O line GIO. The global I/O line /GIO remains high at this time. Data written in the global I/O lines are decided by the polarity of the signal ZWD output from the selection circuit 182 shown in FIG. 13.

[Flow of Data Reading]

Figure 18:
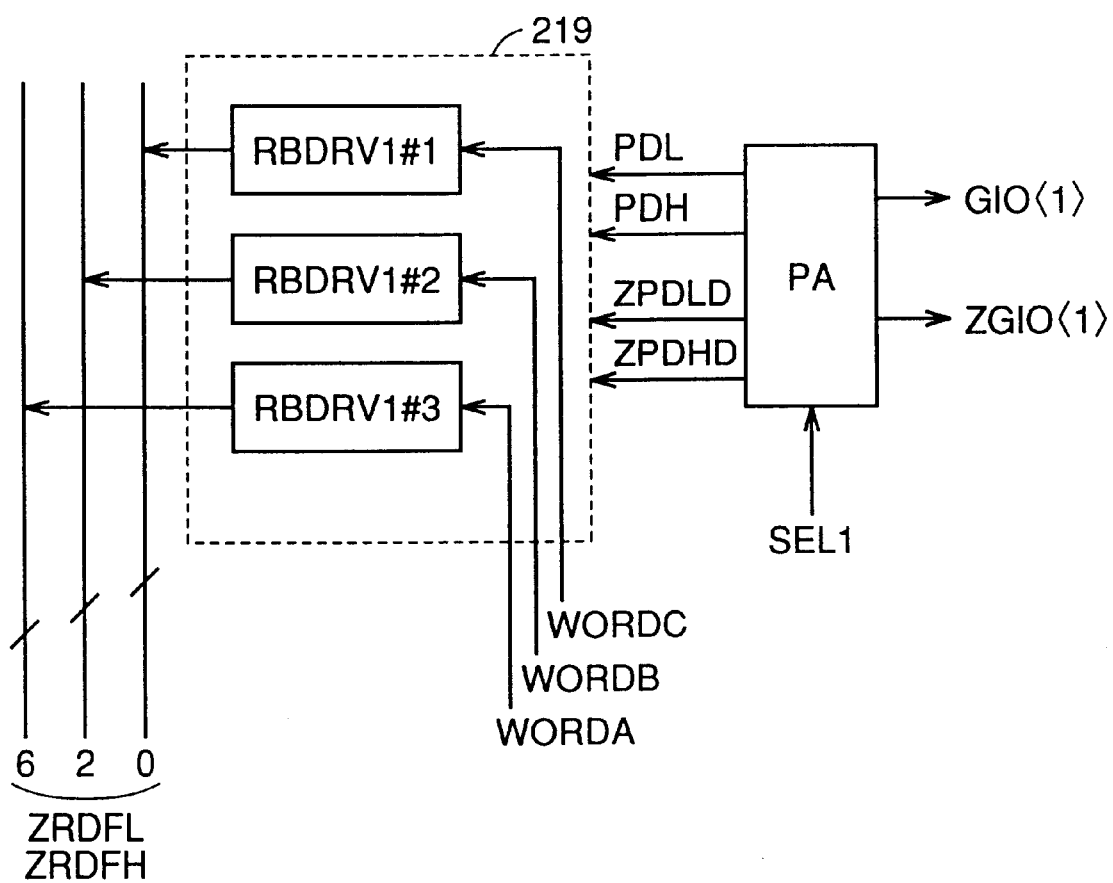
FIG. 18 is a diagram for illustrating the flow of data reading.

FIG. 18 is a diagram for illustrating the flow of data reading.

With reference to FIG. 18, description is made on data reading from the pair of global I/O lines GIO<1> onto the read data lines.

The preamplifier PA receives the data read from global I/O lines GIO<1> and ZGIO<1>. When the selection signal SEL1 supplied from the signal generation circuit 124 shown in FIG. 10 is activated, the preamplifier is activated for amplifying the data appearing on the global I/O lines GIO<1> and ZGIO<1> and outputting signals PDL, PDH, ZPDLD and ZPDHD.

The output signals from the preamplifier PA are input in a circuit 219 driving the read data lines. The circuit 219 outputs the output signals of the preamplifier to any of the read data lines ZRDFL0, ZRDFL2 and ZRDFL6 while outputting complementary signals to any of the read data lines ZRDFH0, ZRDFH2 and ZRDFH6 in response to the states of the selection signals WORDA to WORDC.

The circuit 219 includes three read bus drivers RBDRV1#1 to RBDRV1#3 included in the block 164 shown in FIG. 12.

The read bus driver RBDRV1#1 outputs the output signals of the preamplifier PA to the read data lines ZRDFL0 and ZRDFH0 when the selection signal WORDC is active. The read bus driver RBDRV1#2 outputs the output signals of the preamplifier PA to the read data lines ZRDFL2 and ZRDFH2 when the selection signal WORDB is activated.

The read bus driver RBDRV1#3 outputs the output signals of the preamplifier PA to the read data lines ZRDFL6 and ZRDFH6 when the selection signal WORDA is activated.

Figure 19:
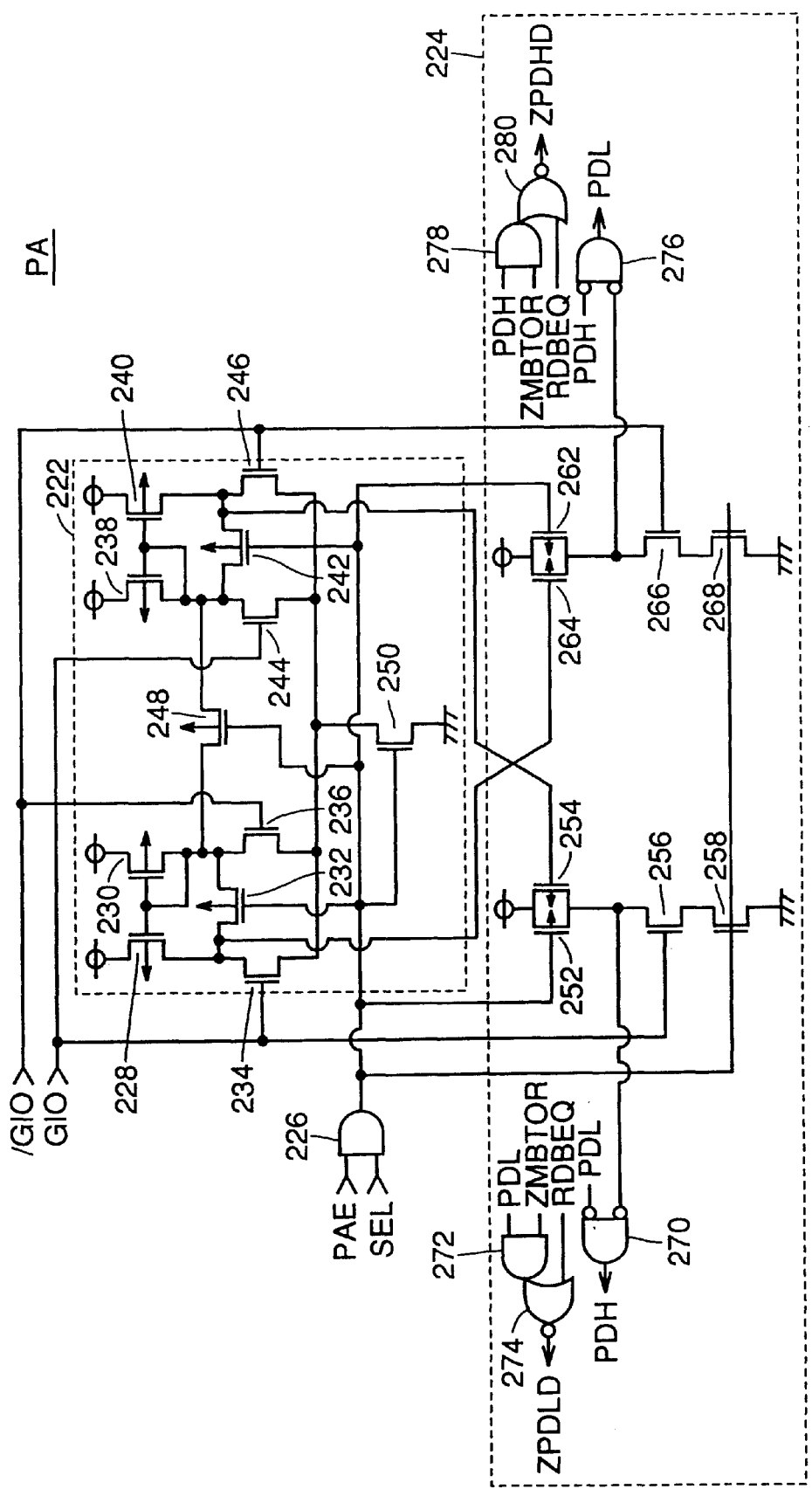
FIG. 19 is a circuit diagram for illustrating the structure of each preamplifier PA shown in FIGS. 12 and 18.

FIG. 19 is a circuit diagram for illustrating the structure of each preamplifier PA shown in FIGS. 12 and 18.

Referring to FIG. 19, the preamplifier PA includes a sensing part 222 sensing the data appearing on the global I/O lines GIO and /GIO, an output part 224 receiving an output of the sensing part 222 and outputting this output to the circuit 219 shown in FIG. 18, and an AND circuit 226 receiving an enable signal PAE and the selection signal SEL and activating the sensing part 222 and the output part 224.

The sensing part 222 includes a P-channel MOS transistor 228 having a source connected to a power supply node, a P-channel MOS transistor 230 having a gate and a drain connected to the gate of the P-channel MOS transistor 228 and a source connected to the power supply node, a P-channel MOS transistor 232 connected between the drains of the P-channel MOS transistors 228 and 230 for receiving an output of the AND circuit 226 in its gate, an N-channel MOS transistor 234 having a gate connected to the global I/O line GIO and a drain connected to the drain of the P-channel MOS transistor 228, an N-channel MOS transistor 236, connected between the drain of the P-channel MOS transistor 230 and the source of the N-channel MOS transistor 234, having a gate connected to the global I/O line /GIO and an N-channel MOS transistor 250 connected between the source of the N-channel MOS transistor 234 and a ground node for receiving the output of the AND circuit 226 in its gate.

The sensing part 222 further includes a P-channel MOS transistor 240 having a source connected to the power supply node, a P-channel MOS transistor 238 having a gate and a drain connected to the gate of the P-channel MOS transistor 240 and a source connected to the power supply node, a P-channel MOS transistor 242 connected between the drains of the P-channel MOS transistors 238 and 240 for receiving the output of the AND circuit 226 in its gate, an N-channel MOS transistor 244, connected between the drain of the P-channel MOS transistor 238 and the source of the N-channel MOS transistor 234, having a gate connected with the global I/O line GIO, an N-channel MOS transistor 246, connected between the drain of the P-channel MOS transistor 240 and the source of the N-channel MOS transistor 234, having a gate connected with the global I/O line /GIO, and a P-channel MOS transistor 248 connected between the drains of the P-channel MOS transistors 230 and 238 for receiving the output of the AND circuit 226 in its gate.

The output part 224 includes a P-channel MOS transistor 252 having a gate receiving the output of the AND circuit 226 and a source connected to the power supply node, a P-channel MOS transistor 254, connected between the power supply node and the drain of the P-channel MOS transistor 252, having a gate connected with the drain of the P-channel MOS transistor 240, an N-channel MOS transistor 256 having a gate connected with the global I/O line GIO and a drain connected to the drain of the P-channel MOS transistor 252, and an N-channel MOS transistor 258 connected between the source of the N-channel MOS transistor 256 and a ground node for receiving the output of the AND circuit 226 in its gate.

The output part 224 further includes a P-channel MOS transistor 262 having a gate receiving the output of the AND circuit 226 and a source connected with the power supply node, a P-channel MOS transistor 264, connected between the power supply node and the drain of the P-channel MOS transistor 262, having a gate connected to the drain of the P-channel MOS transistor 228, an N-channel MOS transistor 266 having a gate connected with the global I/O line /GIO and a drain connected with the drain of the P-channel MOS transistor 262, and an N-channel MOS transistor 268 connected between the source of the N-channel MOS transistor 266 and the ground node for receiving the output of the AND circuit 226 in its gate.

The output part 224 further includes a NOR circuit 270 receiving the potential of the drain of the P-channel MOS transistor 252 and the signal PDL and outputting the signal PDH, an AND circuit 272 receiving the signal PDL and the mode selection signal ZMBTOR, and a NOR circuit 274 receiving an output of the AND circuit 272 and a signal RDBEQ and outputting the signal ZPDLD.

The output part 224 further includes a NOR circuit 276 receiving the potential of the P-channel MOS transistor 262 and the signal PDH and outputting the signal PDL, an AND circuit 278 receiving the signal PDH and the mode selection signal ZMBTOR, and a NOR circuit 280 receiving an output of the AND circuit 278 and the signal RDBEQ and outputting the signal ZPDHD.

Figure 20:
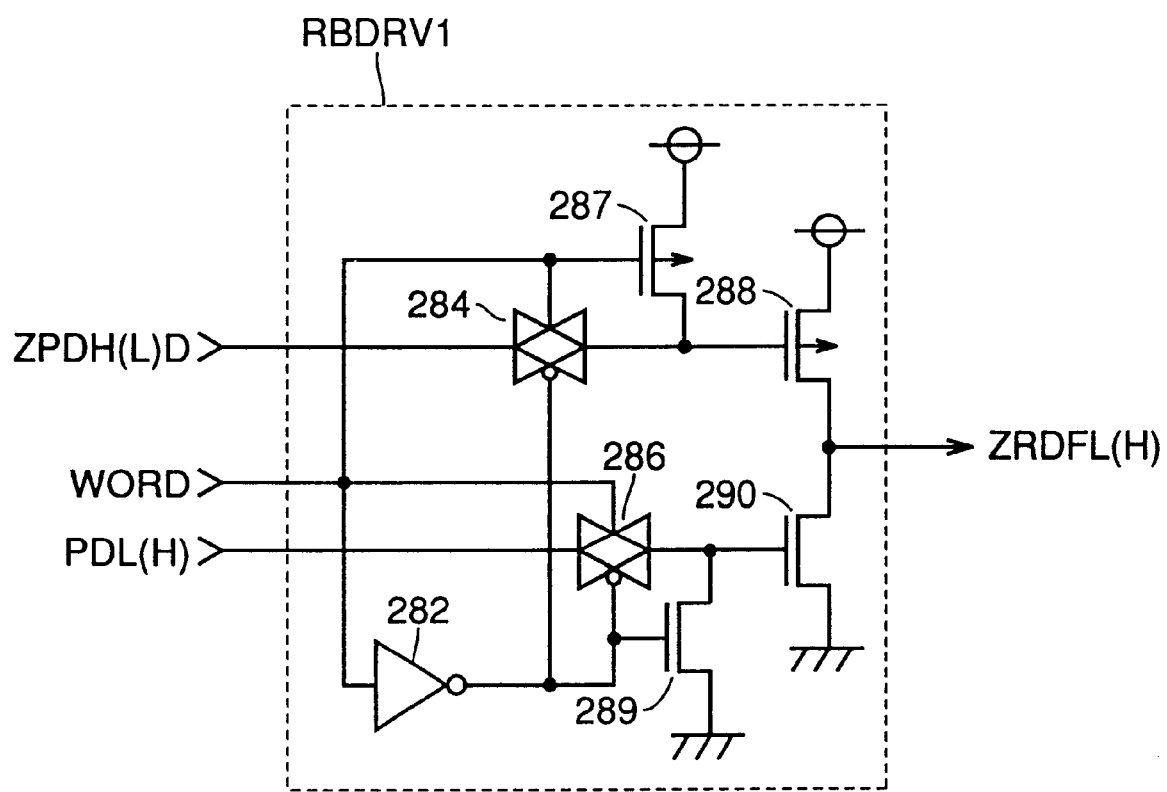
FIG. 20 is a circuit diagram showing the structure of each read bus driver RBDRV1 shown in FIGS. 12 and 18.

FIG. 20 is a circuit diagram showing the structure of each read bus driver RBDRV1 shown in FIGS. 12 and 18.

Referring to FIG. 20, the read bus driver RBDRV1 includes an inverter 282 receiving and inverting the selection signal WORD, a transmission gate 284 outputting the signal ZPDHD when the selection signal WORD is activated in response to the selection signal WORD and an output of the inverter 282, a P-channel MOS transistor 288 having a gate receiving the signal ZPDHD through the transmission gate 284 and a source connected with a power supply node, and a P-channel MOS transistor 287 connected between the power supply node and the gate of the P-channel MOS transistor 288 for receiving the selection signal WORD in its gate.

The read bus driver RBDRV1 further includes a transmission gate 286 receiving the selection signal WORD and an output of the inverter 282 for receiving and transmitting the signal PDL when the selection signal WORD is activated, an N-channel MOS transistor 290 connected between the drain of the P-channel MOS transistor 288 and a ground node for receiving the signal PDL in its gate through the transmission gate 286, and an N-channel MOS transistor 289 connected between a power supply node and the gate of the N-channel MOS transistor 290 for receiving the output of the inverter 282 in its gate.

When the selection signal WORD is inactivated, the N-channel MOS transistor 289 and the P-channel MOS transistor 287 fix the potentials of the gates of the N-channel MOS transistor 290 and the P-channel MOS transistor 288 to low and high levels respectively.

The drain of the P-channel MOS transistor 288 outputs the signal ZRDFL.

When the signals ZPDHL and PDH are supplied to the transmission gates 284 and 286 respectively, the drain of the P-channel MOS transistor 288 outputs the signal ZRDFH.

Any of the selection signals WORDA to WORDC and ZWORDA to ZWORDC shown in FIG. 12 is input in the selection signal WORD.

Figure 21:
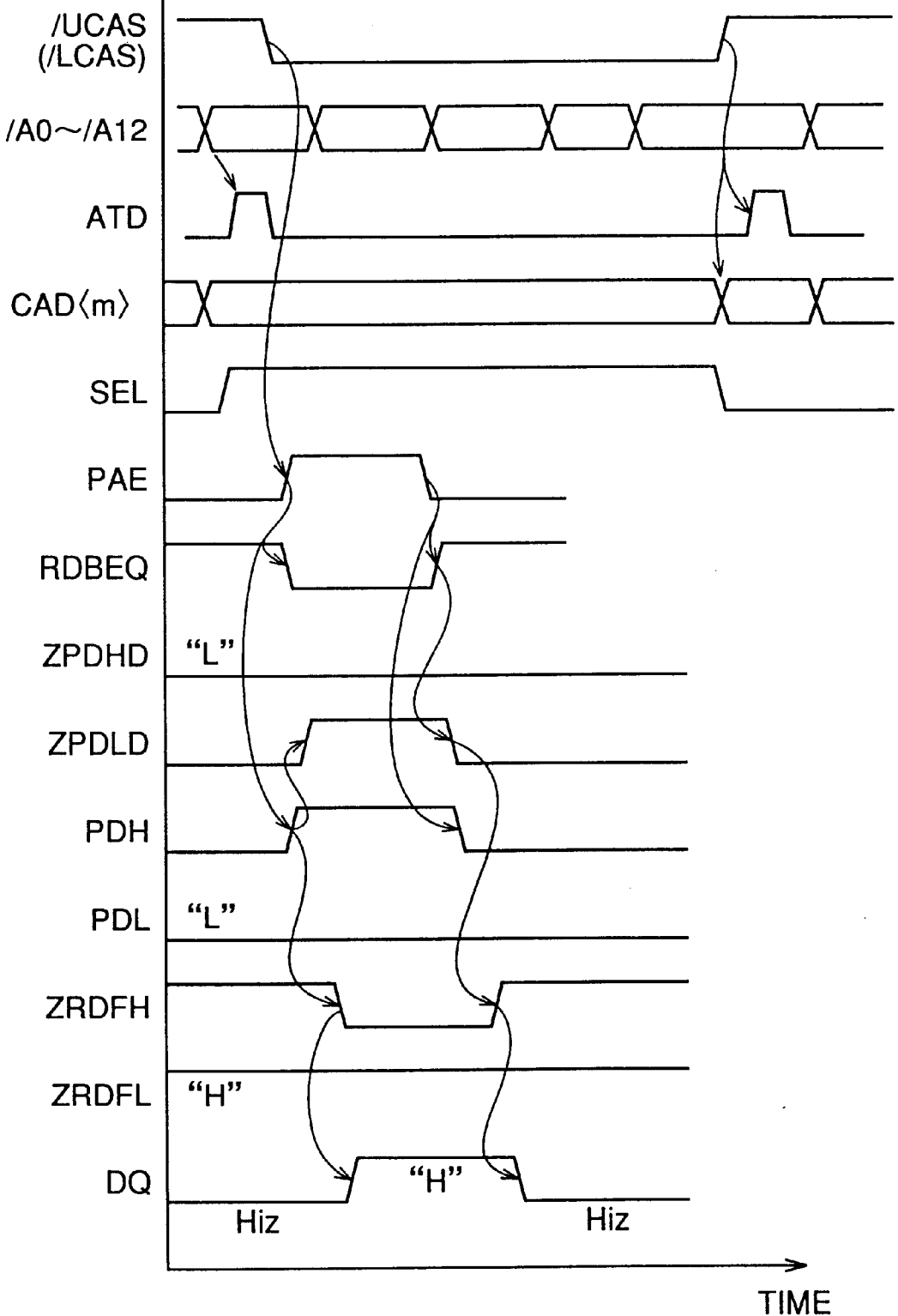
FIG. 21 is an operation waveform diagram for illustrating the flow of data in reading.

FIG. 21 is an operation waveform diagram for illustrating the data flow in reading.

Referring to FIG. 21, the signal ATD is internally generated when a column strobe signal /UCAS for an upper bit mat and a column strobe signal /LCAS for a lower bit mat are high and the address signals /A0 to /A12 change. The corresponding selection signal SEL is activated in response to the mode set by the mode selection signals and a column address signal CAD<n>.

In response to fall of the column strobe signal /UCAS for the upper bit mat and the column strobe signal /LCAS for the lower bit mat, the signal PAE activating the preamplifier is activated while the signal RDBEQ equalizing the read data buses is inactivated at the same.

The preamplifier responsively outputs the signals ZPDHD, ZPDLD, PDH and PDL. These signals are transmitted to the read data buses, data responsive to the outputs of the preamplifier are transmitted to the read data lines ZRDFH and ZRDFL, and data are transmitted to the terminal DQ through the output data buffer.

After a while, the one-shot signal PAE falls to a low level and the signal RDBEQ is activated. At this time, the signals ZPDLD and ZPDHD are precharged low and the signals ZRDHF and ZRDFL are precharged high.

No signal ATD is internally generated when the column strobe signal /UCAS for the upper bit mat and the column strobe signal /LCAS for the lower bit mat are low. If the address signals are different from the preceding ones when the column strobe signal /UCAS for the upper bit mat and the column strobe signal /LCAS for the lower bit mat rise from low levels to high levels next, the signal ATD is responsively internally generated and the signal CAD and the selection signal SEL change.

Figure 28A:
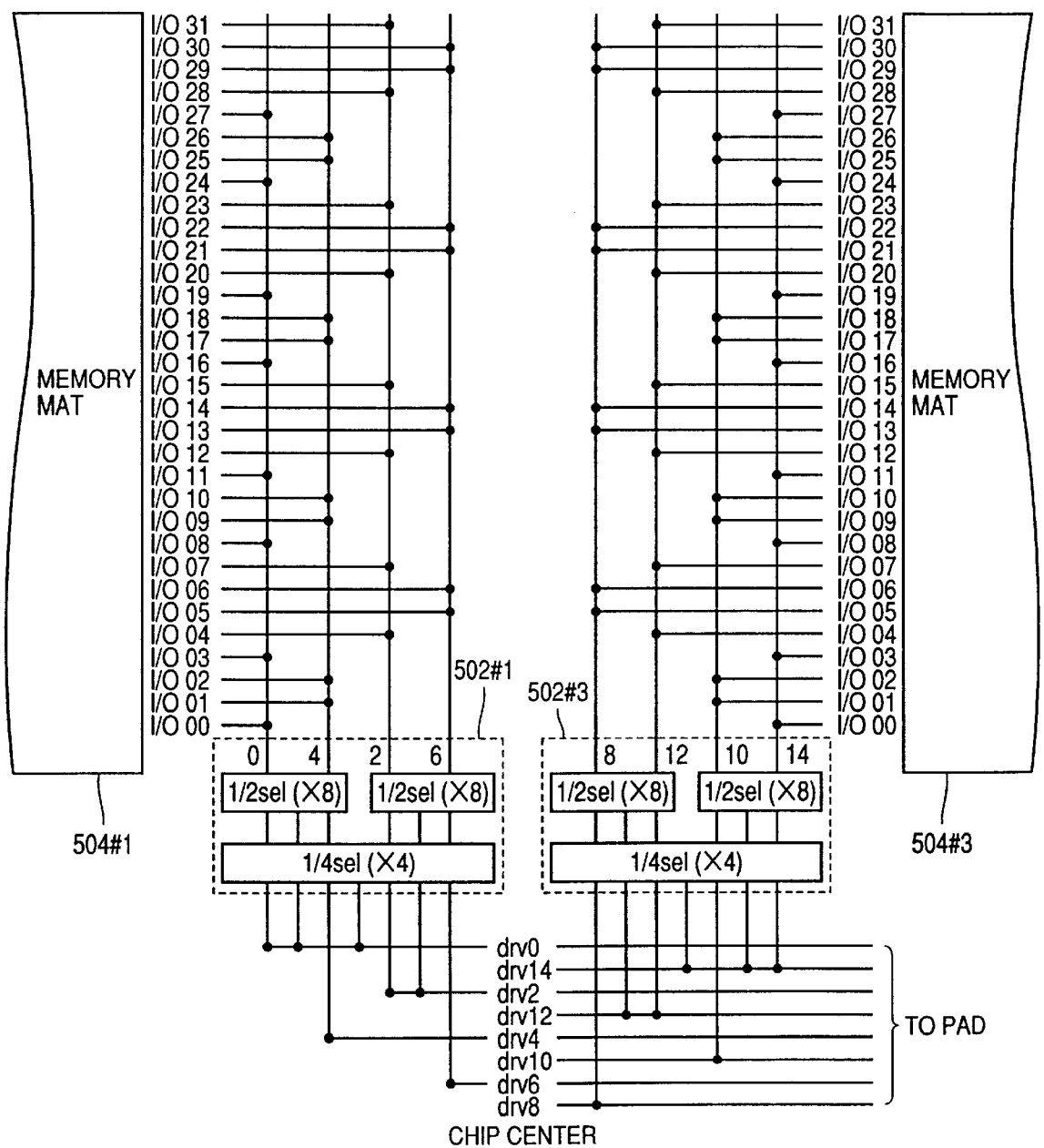
FIGS. 28A and 28B illustrate the structure of data buses of a conventional EDO DRAM.
Figure 28B:
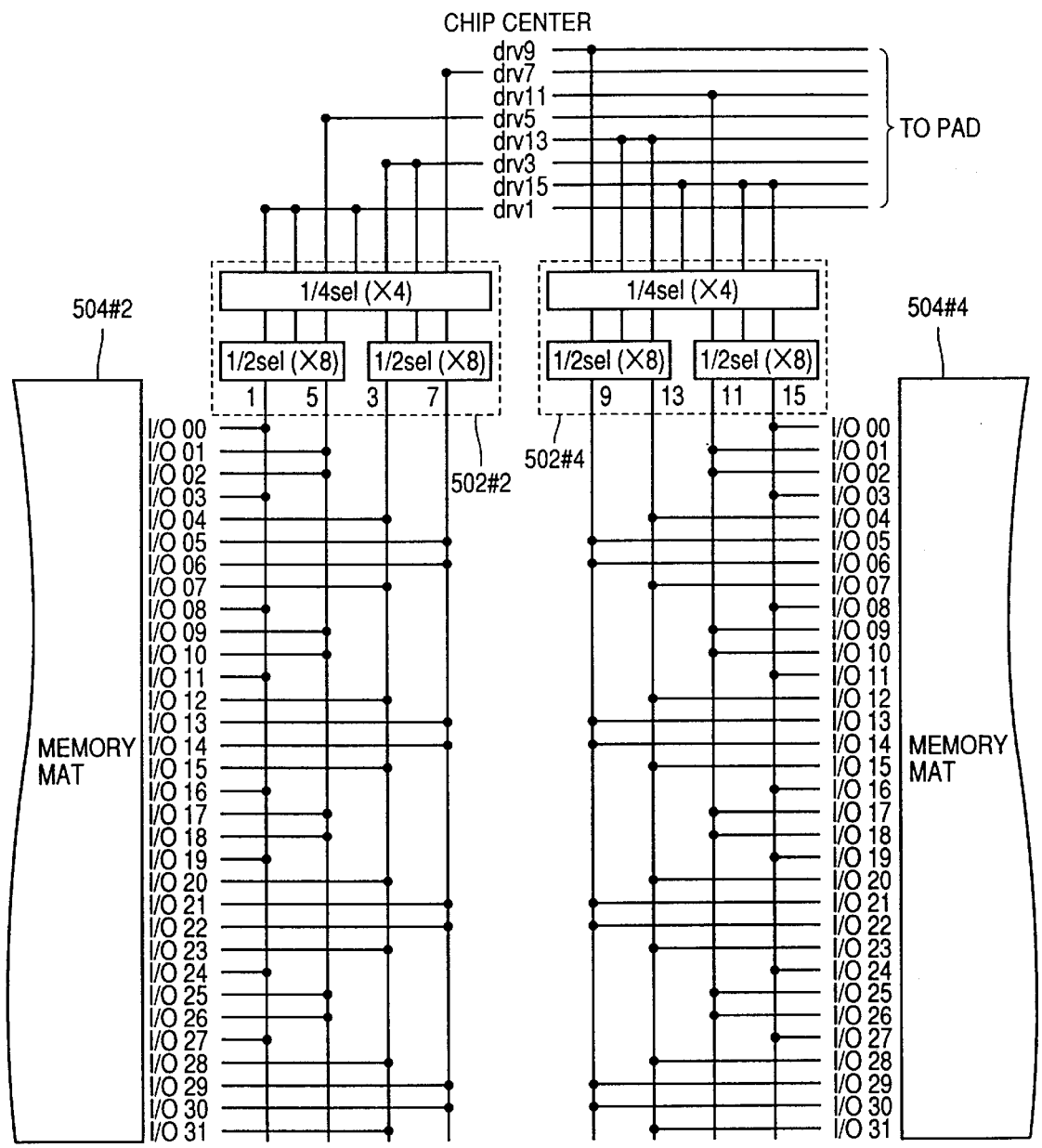
Figure 29:
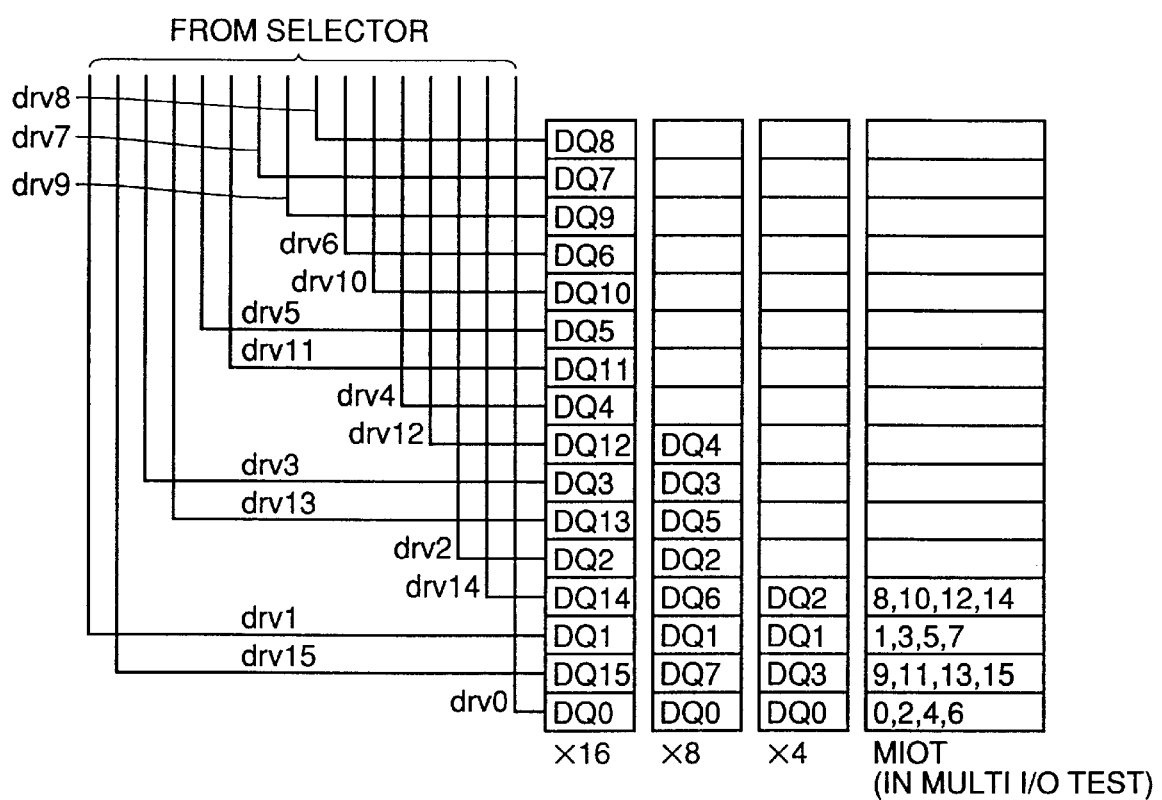
FIG. 29 illustrates the correspondence between data buses drv0 to drv15 and data input/output terminals DQ0 to DQ15 shown in FIGS. 28A and 28B.
Figure 30:
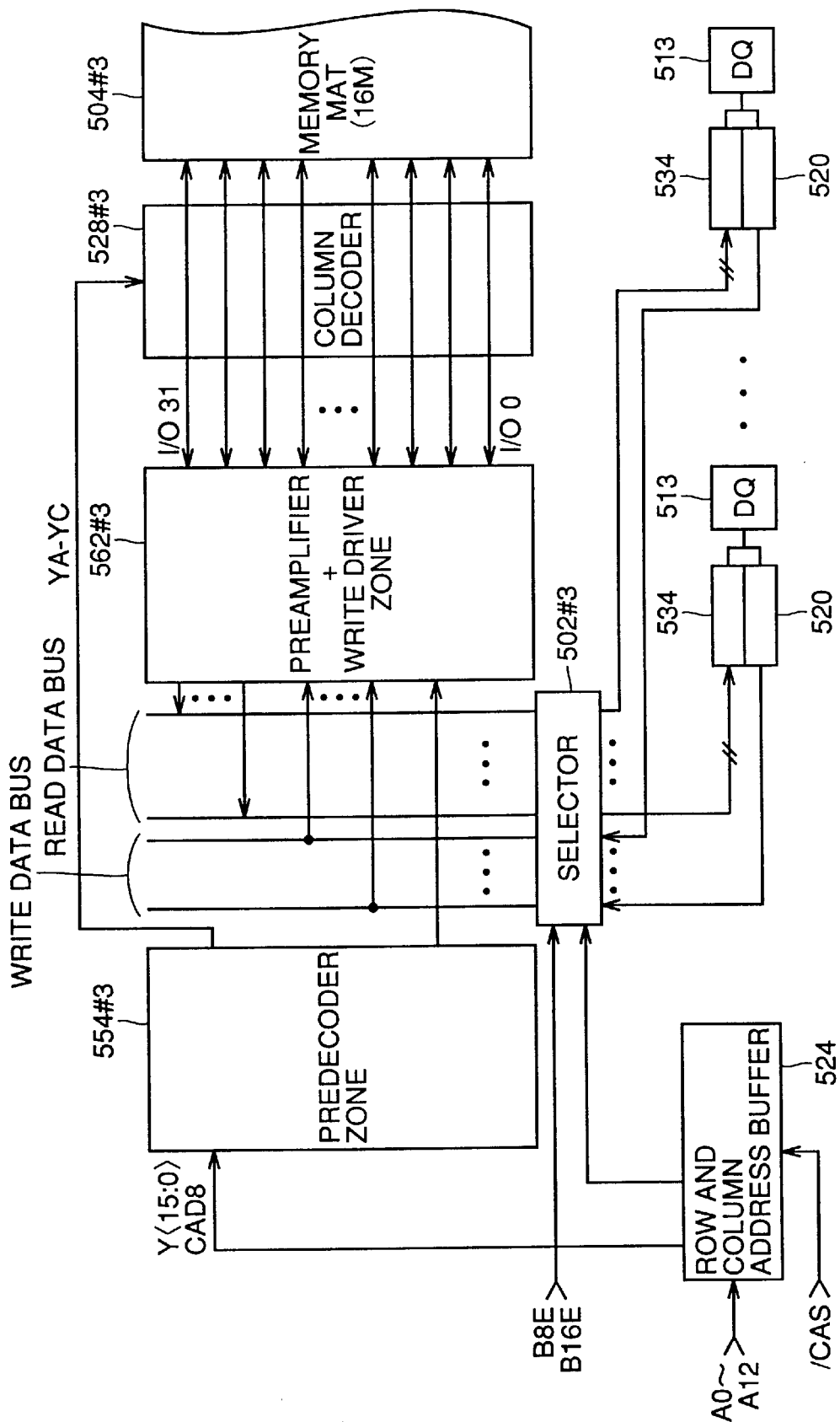
FIG. 30 is a schematic diagram for illustrating the arrangement of data buses for each mat in the conventional EDO DRAM.

When employing the aforementioned data bus structure, the selectors 502#1 to 502#4 shown in FIGS. 28A, 28B and 30 may not be provided on the middle point between the data buses.

The quantity of data propagation delay between the memory mats and the data terminals remains constant regardless of address change or mode switching due to absence of such selectors, to require no critical timing adjustment following address change.

Each memory mat outputs eight pairs of global I/O lines, whereby the number of accompanying preamplifiers can be reduced from 32 to eight in each mat, and the circuit scale can be remarkably reduced.

[Description of Multi-Bit Test]

Figure 22:
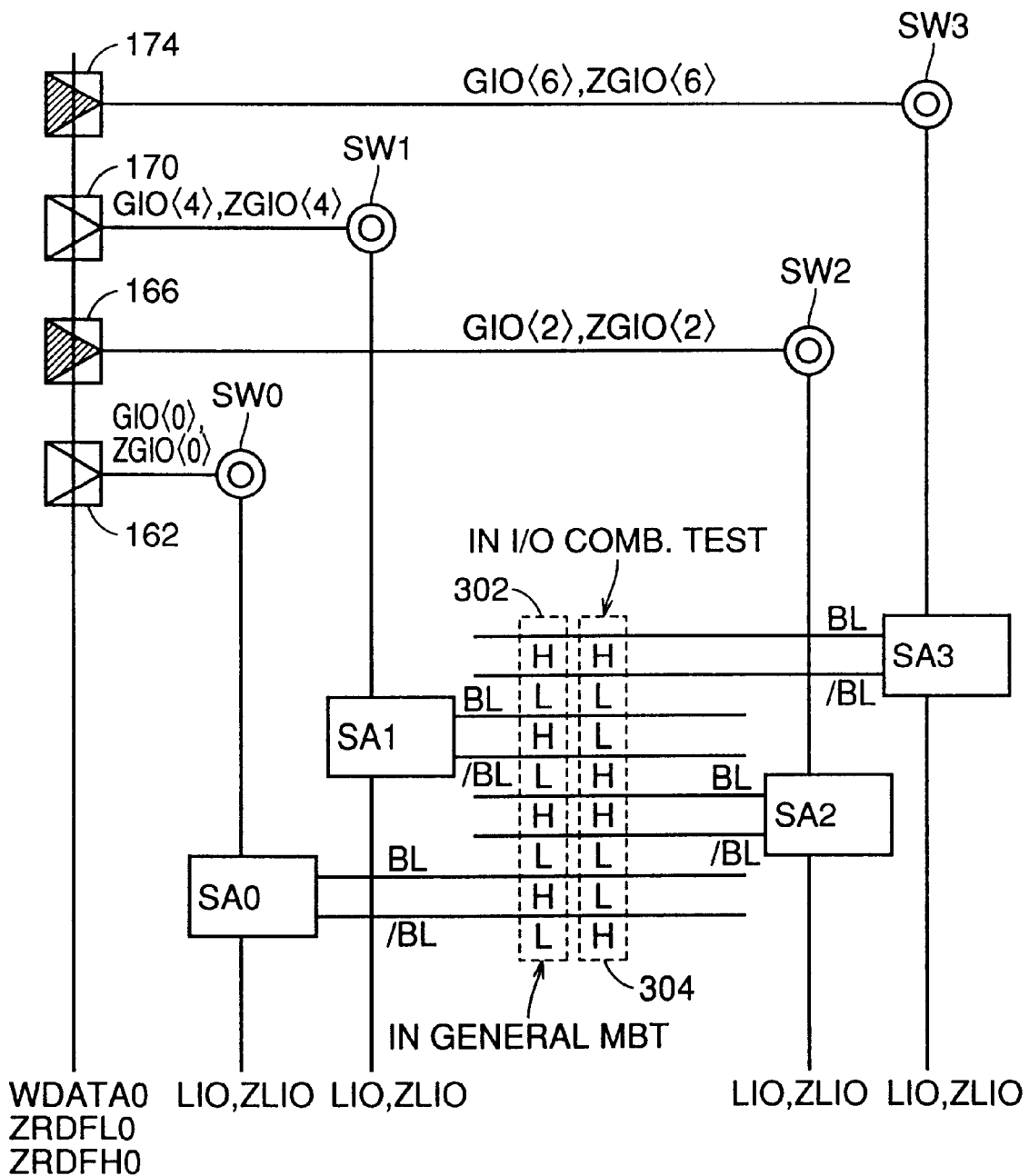
FIG. 22 is a diagram for illustrating multi-bit tests executed in the semiconductor memory device according to the present invention.

FIG. 22 is a diagram for illustrating the multi-bit test executed in the semiconductor memory device according to the present invention.

Referring to FIGS. 12 and 22, data transmitted from the write data line WDATA0 is input in all circuit blocks 162 to 176 in the multi-bit test. FIG. 22 schematically representatively shows a structure related to the pairs of global I/O lines GIO<0>, GIO<2>, GIO<4> and GIO<6>.

Such relation of the arrangement of sense amplifiers and bit lines is referred to as half pitch cell relation.

When data is input in the write data line WDATA0, the same data is written in all pairs of global I/O lines and transmitted to the local I/O lines LIO and ZLIO through switching circuits SW0, SW1, SW2 and SW2 between the pairs of global I/O lines and the pairs of local I/O lines, and sense amplifiers SA0, SA1, SA2 and SA3 set bit lines BL to the same logical level while setting bit lines /BL to a level reverse to that of the bit lines BL.

In other words, the bit lines BL and /BL are set to logical states shown by numeral 302 in the general multi-bit test.

In the multi-bit test, therefore, adjacently arranged bit lines are in different logical states. Thus, when a failure such as short-circuiting takes place across any pair of adjacent bit lines, correct data is not written in the corresponding memory cell. Therefore, the failure can be detected by reading the written data.

In reading, data are output to the circuit blocks 162, 166, 170 and 174 through the pairs of local I/O lines and the pairs of global I/O lines in order reverse to that in writing. These data are simultaneously output to the read data lines ZRDFL0 and ZRDFH0.

When all memory cells are normal with no short-circuiting of bit lines, i.e., when the same data is correctly written in or read from the memory cells, one of the read data lines ZRDFH0 and ZRDFL0 goes low.

If a failure takes place, both read data lines ZRDFL0 and ZRDFH0 go low. This is because wired ORing of the circuit blocks 162, 166, 170 and 174 is taken on the read data lines. Thus, the multi-bit test is executable.

However, short-circuiting undiscoverable in the multi-bit test, such as short-circuiting across separate bit lines holding a single bit line therebetween, for example, may take place across bit lines. Such a failure takes place when short-circuiting occurs in a conductive layer present under a wiring layer provided with the bit lines, for example.

The semiconductor memory device according to the present invention can execute an I/O combination test capable of detecting short-circuiting across alternate bit lines.

In the I/O combination test, the circuit blocks 162 and 170 invert the data transmitted to the write data line WDATA0 and output the inverted data to the pairs of global I/O lines.

In this case, the bit lines are set to logical states shown by numeral 304 in FIG. 22. Thus, short-circuiting across alternate bit lines can also be detected in the multi-bit test.

The circuit blocks 162 and 170 further invert the data read on the pairs of global I/O lines and output the data to the read data lines ZRDFL0 and ZRDFH0. Thus, the data can be degenerated and read similarly to the case of the general multi-bit test.

Figure 23:
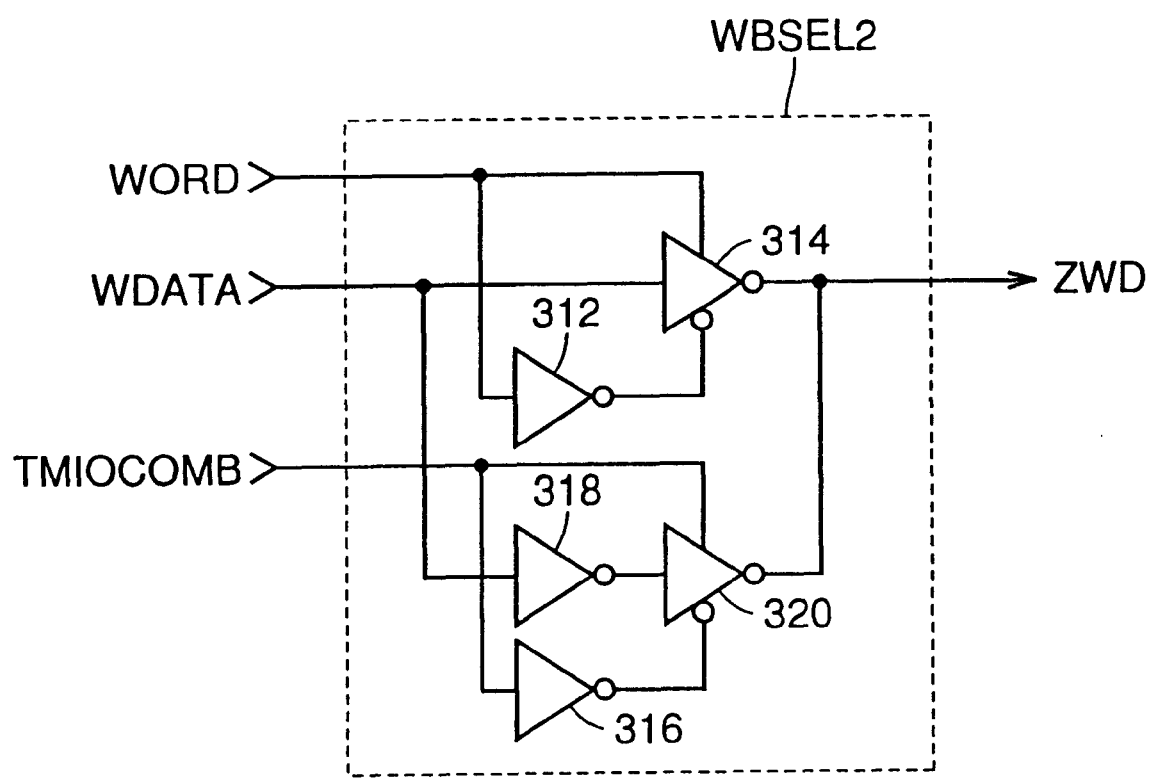
FIG. 23 a circuit diagram showing the structure of each write bus selector WBSEL shown in FIG. 12.

FIG. 23 is a circuit diagram showing the structure of each write bus selector WBSEL2 shown in FIG. 12.

Referring to FIG. 23, the write bus selector WBSEL2 includes an inverter 312 receiving and inverting the selection signal WORD, an inverter 316 receiving and inverting a signal TMIOCOMB activated in a combination I/O test mode, and a clocked inverter 314 activated by the selection signal WORD and an output of the inverter 312 when the selection signal WORD is high for inverting write data transmitted to the write data line WDATA and outputting the inverted data as the signal ZWD.

The write bus selector WBSEL2 further includes an inverter 318 receiving and inverting the data transmitted to the write data line WDATA, and a clocked inverter 320 receiving the signal TMIOCOMB and an output of the inverter 316 and activated in the I/O combination test for receiving and inverting an output of the inverter 318 and outputting the inverted output as the signal ZWD.

The circuit blocks 162, 168, 170 and 176 shown in FIG. 12 include such write bus selectors WBSEL2, and hence data obtained by inverting data written in the general multi-bit test are written in the pairs of global I/O lines GIO<0>, GIO<3>, GIO<4> and GIO<7> in the I/O combination test mode.

Figure 24:
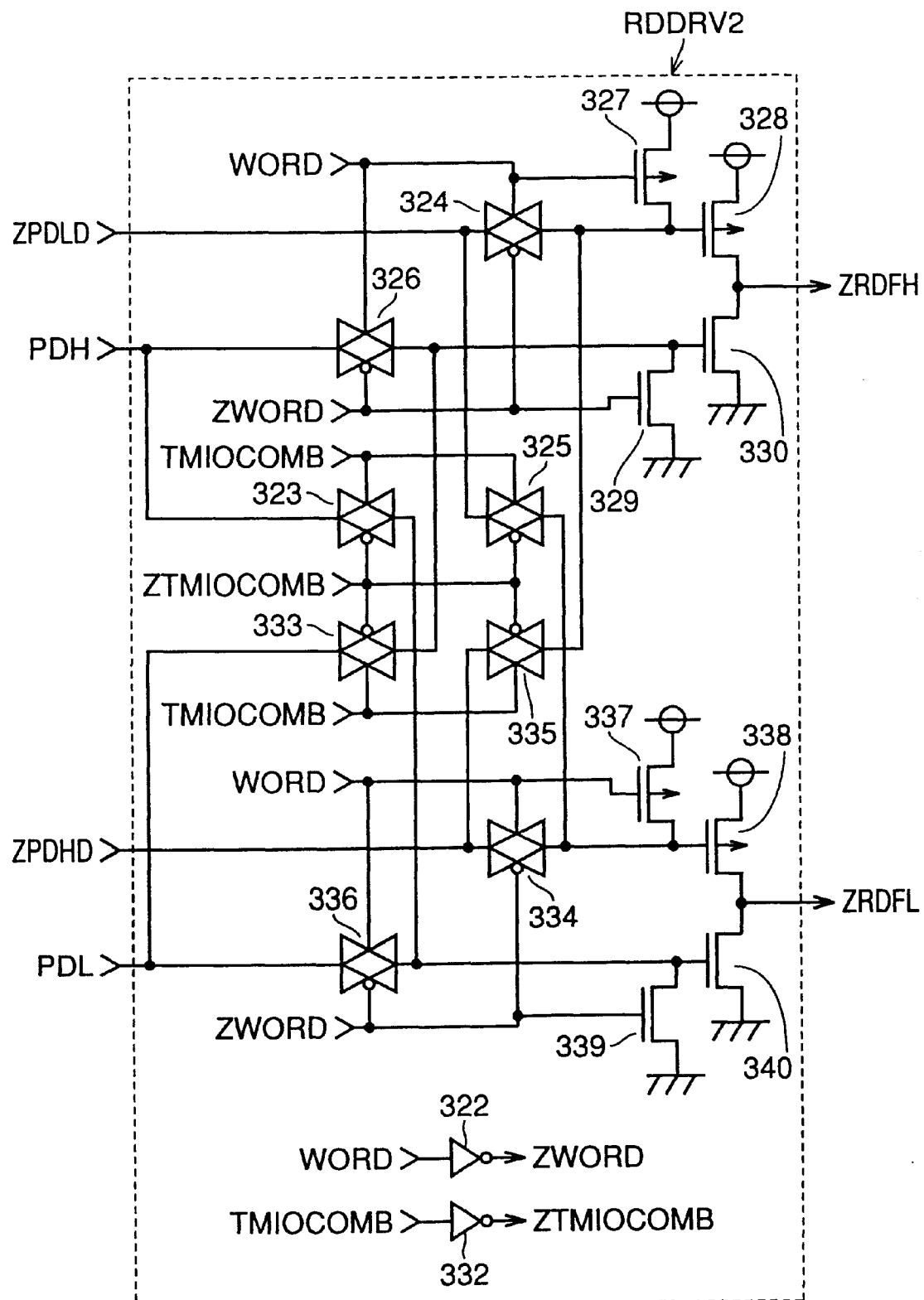
FIG. 24 is a circuit diagram showing the structure of each read bus driver RBDRV2 shown in FIG. 12.

FIG. 24 is a circuit diagram showing the structure of each read bus driver RBDRV2 shown in FIG. 12.

Referring to FIG. 24, the read bus driver RBDRV2 includes an inverter 322 receiving and inverting the selection signal WORD and outputting the signal ZWORD, an inverter 332 receiving and inverting the signal TMIOCOMB and outputting a signal ZTMIOCOMB, a transmission gate 324 rendered conductive when the selection signal WORD is high in response to the selection signal WORD and the signal ZWORD for receiving and transmitting the signal ZPDLD, a P-channel MOS transistor 328 having a gate receiving the signal ZPDLD through the transmission gate 324 and a source connected to a power supply node, and a P-channel MOS transistor 327, connected between the power supply node and the gate of the P-channel MOS transistor 328, receiving the signal WORD in its gate.

The read bus driver RBDRV2 further includes a transmission gate 326 rendered conductive when the selection signal WORD is high in response to the selection signal WORD and the signal ZWORD for transmitting the signal PDH, an N-channel MOS transistor 330 connected between the drain of the P-channel MOS transistor 328 and a ground node for receiving the signal PDH in its gate through the transmission gate 326, and an N-channel MOS transistor 329, connected between the ground node and the gate of the N-channel MOS transistor 330, receiving the signal ZWORD in its gate. The drain of the P-channel MOS transistor 328 outputs the signal ZRDFH.

The read bus driver RBDRV2 further includes a transmission gate 334 rendered conductive when the selection signal WORD is high in response to the selection signal WORD and the signal ZWORD for transmitting the signal ZPDHD, a P-channel MOS transistor 338 having a gate receiving the signal ZPDHD through the transmission gate 334 and a source connected to the power supply node, and a P-channel MOS transistor 337, connected between the power supply node and the gate of the P-channel MOS transistor 338, receiving the selection signal WORD in its gate.

The read bus driver RBDRV2 further includes a transmission gate 336 rendered conductive when the selection signal WORD is high in response to the selection signal WORD and the signal ZWORD for transmitting the signal PDL, an N-channel MOS transistor 340 connected between the drain of the P-channel MOS transistor 338 and the ground node for receiving the signal PDL in its gate through the transmission gate 336, and an N-channel MOS transistor 339 connected between the ground node and the gate of the N-channel MOS transistor 340 for receiving the signal ZWORD in its gate. The drain of the P-channel MOS transistor 338 outputs the signal ZRDFL.

The read bus driver RBDRV2 further includes transmission gates 323, 325, 333 and 335 rendered conductive in the I/O combination test in response to the signals TMICOMB and ZTMIOCOMB.

The transmission gate 323 transmits the signal PDH to the gate of the N-channel MOS transistor 340 when rendered conductive. The transmission gate 325 transmits the signal ZPDLD to the gate of the P-channel MOS transistor 338 when rendered conductive.

The transmission gate 333 transmits the signal PDL to the gate of the N-channel MOS transistor 330 when rendered conductive. The transmission gate 335 transmits the signal ZPDHD to the gate of the P-channel MOS transistor 328 when rendered conductive.

Referring to FIG. 12, the circuit blocks 162, 168, 170 and 176 employ such read bus drivers RBDRV2. In the I/O combination test mode, therefore, data read from the pairs of global I/O lines GIO<0>, GIO<3>, GIO<4> and GIO<7> connected with these circuit blocks are inverted and transmitted to the read data buses.

Figure 25:
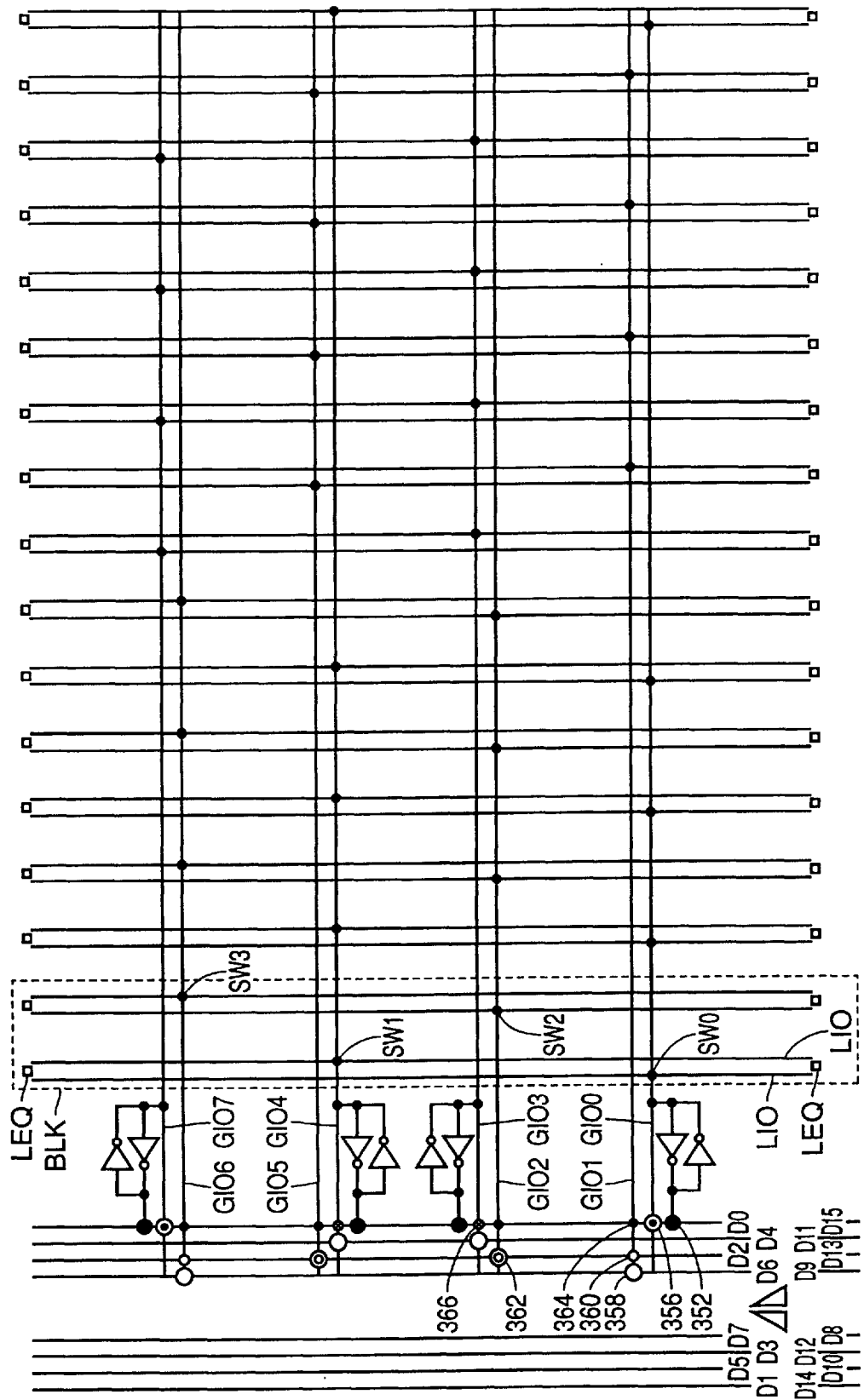
FIG. 25 schematically illustrates the connection between the pairs of global I/O lines and the data buses shown in FIG. 12.

FIG. 25 schematically illustrates the connection between the pairs of global I/O lines and the data buses shown in FIG. 12.

Referring to FIG. 25, each of data buses D0, D4, D2 and D6 symbolically expresses a data bus including a plurality of write data lines and a plurality of pairs of read data lines.

A switch 352 connects the data bus D0 with the pair of global I/O lines GIO0 in the I/O combination test.

FIG. 25 symbolically shows that data polarity is inverted in data writing and data reading when the data bus D0 is coupled with the pair of global I/O lines GIO0 through the path of the switch 352.

Similarly, the switch 352 couples the data bus D0 with the pair of global I/O lines GIO3 in the I/O combination test. The switch 352 also couples the data bus D0 with the pair of global I/O lines GIO4. The switch 352 also couples the data bus D0 with the pair of global I/O lines GIO7.

With reference to FIG. 25, consider that a single word line is activated for reading data in a block BLK (×4,×8 and ×16), for example. In this case, data are output to the pairs of global I/O lines GIO<0>, GIO<2>, GIO<4> and GIO<6> through the switches SW0 to SW3. At this time, the signal ZCAD9 is high and the circuit shown in FIG. 10 selects and activates the signals SEL0, SEL2, SEL4 and SEL6 in response to the respective modes. The signals SEL0 to SEL7 control conductive states of switches 352 to 366.

The switch 356 couples the data buses with the pairs of global I/O lines in common in the ×4,×8 and ×16 modes, the switch 364 couples the data buses with the pairs of global I/O lines only in the ×4 mode, the switch 360 couples the data buses with the pairs of global I/O lines only in the ×8 mode, and the switch 358 couples the data buses with the pairs of global I/O lines only in the ×16 mode.

The switch 362 couples the data buses with the pairs of global I/O lines in both of the ×8 and ×16 modes, and the switch 366 couples the data buses with the pairs of global I/O lines in the ×4 and ×8 modes in common.

[Description of Equalization of Pairs of Local I/O Lines]

Referring to FIG. 25, the structure of each memory mat is described. 34 pairs of local I/O lines are provided in parallel with the shorter side of the memory mat. In order to equalize the pairs of local I/O lines, equalizer circuits LEQ are provided along the upper and lower longer sides of the memory mat.

Figure 26:
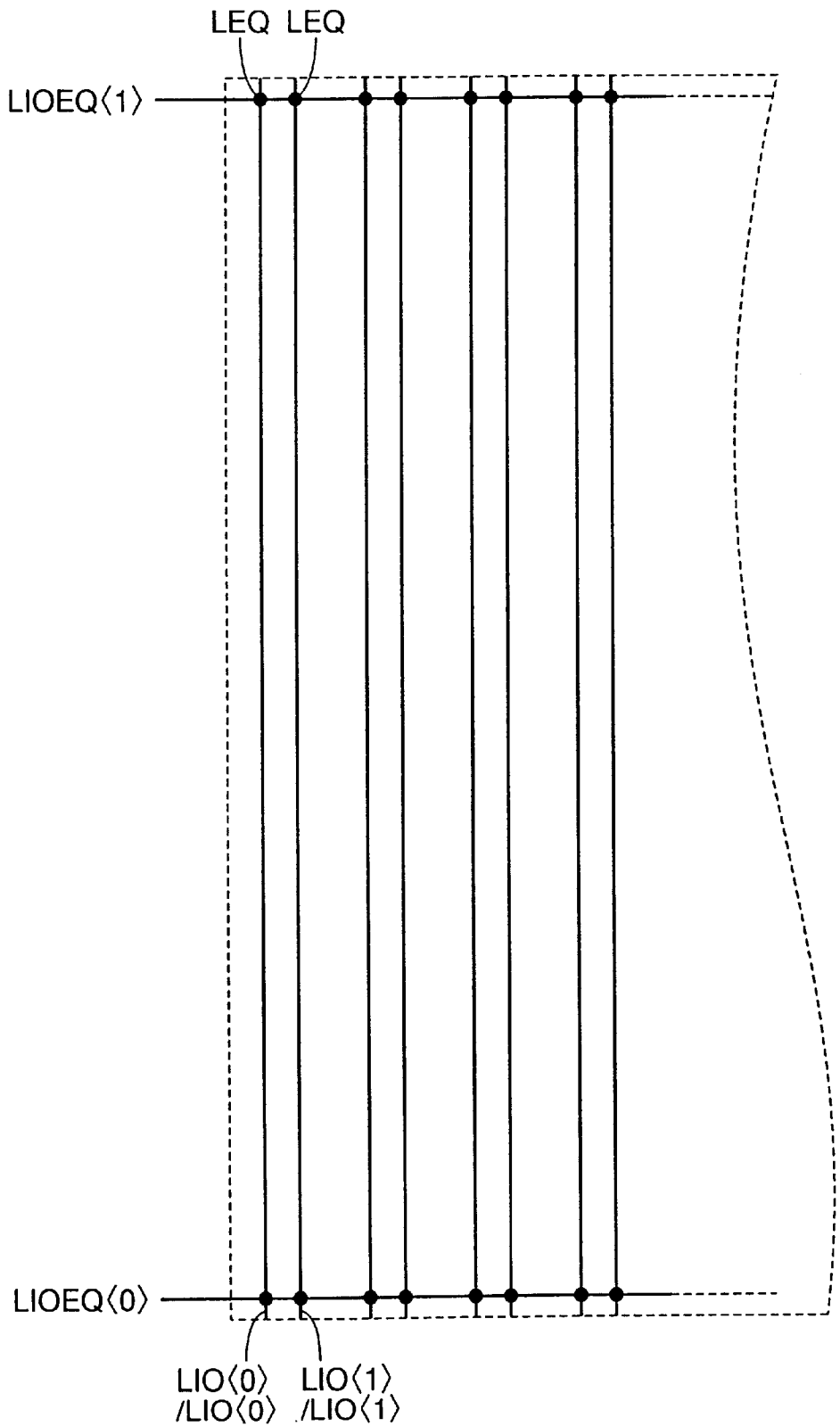
FIG. 26 is an enlarged diagram showing the relation between local I/L lines LIO and /LIO of the memory mat and equalizer circuits LEQ.

FIG. 26 is an enlarged diagram showing the relation between the local I/O lines LIO and /LIO and the equalizer circuits LEQ of the memory mat.

Referring to FIG. 26, the pairs of local I/O lines of the memory mat are not divided in the semiconductor memory device according to the present invention, whereby the number of the equalizer circuits LEQ can be reduced.

The equalizer circuits LEQ are arranged on positions along both ends of the local I/O lines LIO and /LIO, i.e., along the upper and lower longer sides of the memory mat. Thus, equalization of the pairs of local I/O lines can be controlled with only two control wires LIOEQ<0> and LIOEQ<1> transmitting the equalizer signals for the pairs of local I/O lines activating the equalizer circuits LEQ.

Figure 32:
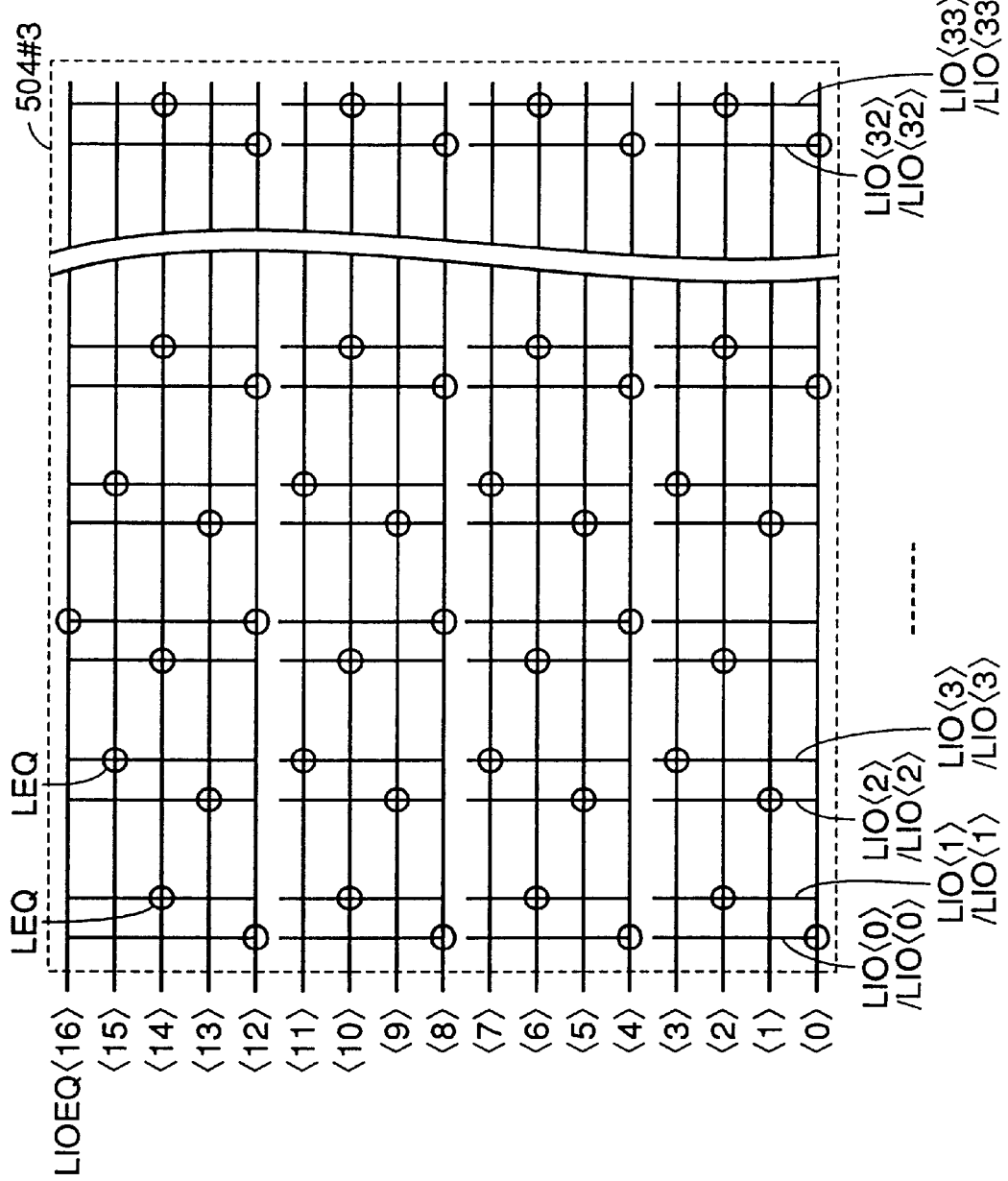
FIG. 32 is a diagram for illustrating the arrangement of equalizer circuits LEQ equalizing pairs of local I/O lines in the conventional EDO DRAM and equalizer signals activating the equalizer circuits LEQ.

Therefore, the number of the control signals equalizing the pairs of local I/O lines can be remarkably reduced as compared with the conventional memory mat shown in FIG. 32.

Figure 27:
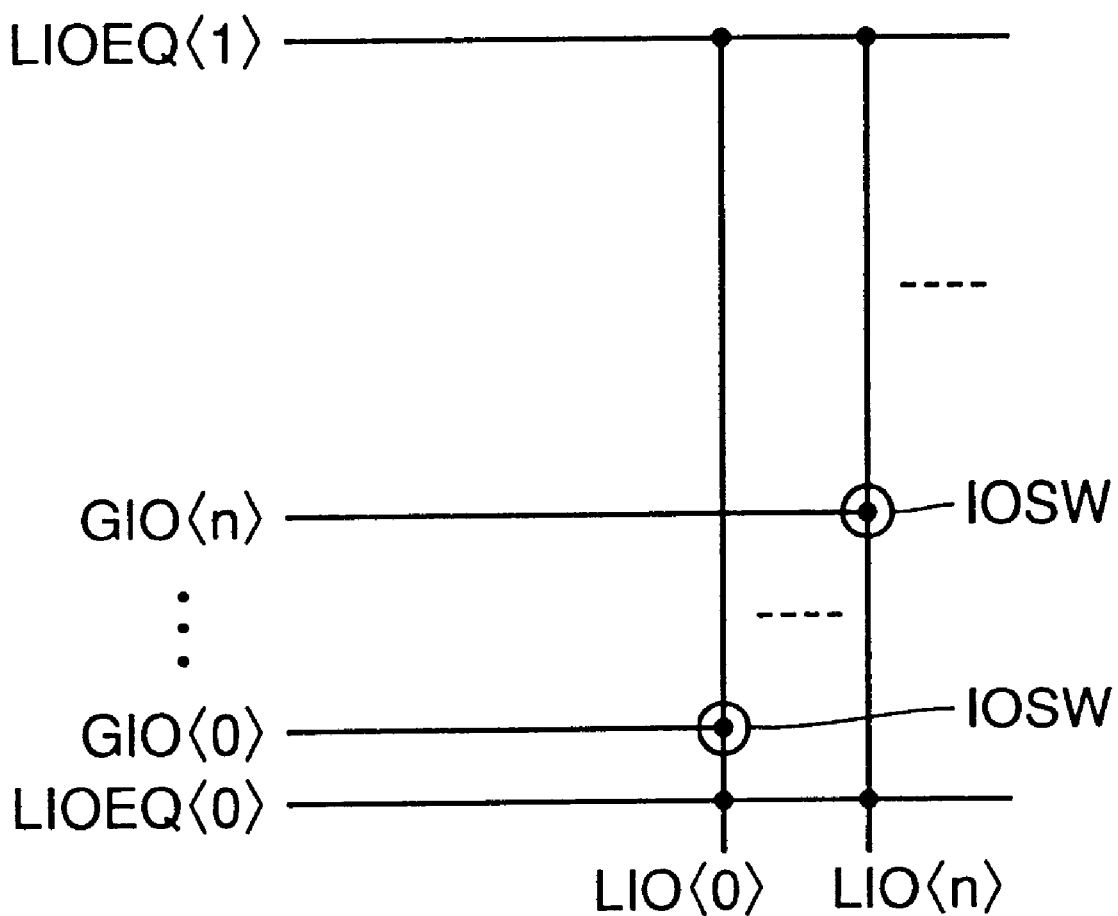
FIG. 27 simply illustrates the arrangement of signals LIOEQ<0> and LIOEQ<1> equalizing pairs of local I/O lines, the pairs of local I/O lines LIO<0> . . . , LIO<n> and pairs of global I/O lines GIO<0> . . . , GIO<n>.

FIG. 27 simply illustrates the arrangement of the signals LIOEQ<0> and LIOEQ<1> equalizing the pairs of local I/O lines, the pairs of local I/O lines LIO<0> . . . , LIO<n> and the pairs of global I/O lines GIO<0> . . . , GIO<n>.

Referring to FIG. 27, the number of the wires transmitting the control signals equalizing the pairs of local I/O lines is reduced, whereby the degree of freedom in arrangement of the pairs of global I/O lines is increased as compared with the prior art. Thus, the pairs of global I/O lines can be properly arranged while optimizing read propagation delay from each part of the memory mat.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device capable of switching the number of terminals inputting/outputting data with a mode switching signal, comprising:

a plurality of memory mats each having a rectangular shape, each said memory mat including a plurality of memory cells arranged in rows and columns, a plurality of pairs of bit lines provided in correspondence to said columns of said plurality of memory cells, and a plurality of pairs of global I/O lines transmitting/receiving data to/from said plurality of pairs of bit lines;

a plurality of data buses, provided in correspondence to each said memory mat, at least partially arranged in parallel with a shorter side of each said memory mat; and a plurality of input/output circuit zones each provided along said shorter side of each said memory mat for transferring data between said plurality of pairs of global I/O lines and said data buses, each said input/output circuit zone including a selection portion selecting a data line corresponding to said plurality of pairs of global I/O lines from a plurality of data lines included in said data buses in response to said mode switching signal.

2. The semiconductor memory device according to claim 1, wherein said plurality of memory mats are first to fourth memory mats arranged in two rows and two columns on a memory area having a rectangular shape, said first memory mat is arranged on a position of the first row and the second column of said memory area, said second memory mat is arranged on a position of the first row and the first column of said memory area so that a shorter side of said second memory mat is opposed to a shorter side of said first memory mat, said third memory mat is arranged on a position of the second row and the first column of said memory area, said fourth memory mat is arranged on a position of the second row and the second column of said memory area so that a shorter side of said fourth memory mat is opposed to a shorter side of said third mat, first and second data buses provided in correspondence to said first and second memory mats respectively are at least partially arranged on an area between said first and second memory mats among said plurality of data buses, and third and fourth data buses provided in correspondence to said third and fourth memory mats respectively are at least partially arranged on an area between said third and fourth memory mats among said plurality of data buses, said semiconductor memory device further comprising a plurality of data input/output pads provided between said memory mats arranged on the first row of said memory area and said memory mats arranged on the second row for transmitting/receiving data to/from said first to fourth data buses.

3. The semiconductor memory device according to claim 2, further comprising:

an address buffer arranged on a central portion of said memory area for capturing an external address signal and outputting a column selection signal toward said first to fourth memory mats; and a first address bus provided on said area between said first and second memory mats and at least partially provided between said first and second data buses for transmitting said output of said address buffer to said first and second memory mats.

4. The semiconductor memory device according to claim 3, wherein said address buffer includes an address conversion circuit converting said external address signal and outputting said column selection signal in response to said mode switching signal.

5. The semiconductor memory device according to claim 2, wherein said first and second memory mats transmit/receive data to/from said plurality of data input/output pads corresponding to a lower bit of input/output data, and said third and fourth memory mats transmit/receive data to/from said plurality of data input/output pads corresponding to an upper bit of input/output data, said semiconductor memory device further comprising:
a first control bus provided on said area between said first and second memory mats for controlling transfer of data of said lower bit; and a second control bus provided on said area between said third and fourth memory mats for controlling transfer of data of said upper bit.

6. The semiconductor memory device according to claim 1, wherein said selection portion includes:

a plurality of selection circuits provided in correspondence to said plurality of pairs of global I/O lines respectively for receiving data from a plurality of write data lines included in said data bus and outputting corresponding data in response to said mode switching signal, and a plurality of write drive circuits activated in response to column selection signal for receiving said outputs of said plurality of selection circuits and outputting said outputs to said pairs of global I/O lines respectively.

7. The semiconductor memory device according to claim 1, wherein said selection portion includes:

a plurality of preamplifier circuits activated in response to column selection signal for amplifying data read from said plurality of pairs of global I/O lines respectively, and a plurality of selection circuits selecting a corresponding pair of read data lines from a plurality of pairs of read data lines included in said data bus and outputting outputs of said plurality of preamplifier circuits respectively in response to said mode switching signal.

8. The semiconductor memory device according to claim 1, wherein each said memory mat includes:

a plurality of pairs of local I/O lines arranged in parallel with a shorter side of said memory mat for transmitting data between said plurality of pairs of bit lines and said plurality of pairs of global I/O lines, a first equalizer circuit provided in correspondence to each said pair of local I/O lines on the side of a first longer side of said memory mat, a second equalizer circuit provided in a pair with said first equalizer circuit on the side of a second longer side of said memory mat, a first control line provided along said first longer side of said memory mat for controlling said first equalizer circuit, and a second control line provided along said second longer side of said memory mat for controlling said second equalizer circuit.

* * * * *